United States Patent
Kaneko et al.

(10) Patent No.: US 10,998,183 B2
(45) Date of Patent: May 4, 2021

(54) SUBSTRATE CLEANING APPARATUS, SUBSTRATE CLEANING SYSTEM, SUBSTRATE CLEANING METHOD AND MEMORY MEDIUM

(71) Applicant: TOKYO ELECTRON LIMITED, Minato-ku (JP)

(72) Inventors: Miyako Kaneko, Nirasaki (JP); Takehiko Orii, Nirasaki (JP); Satoru Shimura, Nirasaki (JP); Masami Yamashita, Koshi (JP); Itaru Kanno, Minato-ku (JP)

(73) Assignee: TOKYO ELECTRON LIMITED, Minato-ku (JP)

(*) Notice: Subject to any disclaimer, the term of this patent is extended or adjusted under 35 U.S.C. 154(b) by 0 days.

(21) Appl. No.: 15/041,273

(22) Filed: Feb. 11, 2016

(65) Prior Publication Data
US 2016/0163534 A1 Jun. 9, 2016

Related U.S. Application Data

(62) Division of application No. 13/961,110, filed on Aug. 7, 2013, now abandoned.

(30) Foreign Application Priority Data

Aug. 7, 2012 (JP) .............................. JP2012-175417
Oct. 16, 2012 (JP) .............................. JP2012-229166
Apr. 30, 2013 (JP) .............................. JP2013-095996

(51) Int. Cl.
*H01L 21/02* (2006.01)
*H01L 21/67* (2006.01)
(Continued)

(52) U.S. Cl.
CPC ............ *H01L 21/0206* (2013.01); *B08B 3/08* (2013.01); *H01L 21/02041* (2013.01);
(Continued)

(58) Field of Classification Search
None
See application file for complete search history.

(56) References Cited

U.S. PATENT DOCUMENTS 4,679,423 A 7/1987 Ballentine
5,075,064 A * 12/1991 Kawaratani ............ B29C 41/28
264/205

(Continued)

FOREIGN PATENT DOCUMENTS

JP 08-318181 12/1996
JP 2000-269178 A 9/2000
(Continued)

OTHER PUBLICATIONS

Material Safety Data Sheet; Ethylene Glycol Dimethyl Ether.*

*Primary Examiner* — Mikhail Kornakov
*Assistant Examiner* — Pradhuman Parihar
(74) *Attorney, Agent, or Firm* — Oblon, McClelland, Maier & Neustadt, L.L.P.

(57) ABSTRACT

A method for cleaning a substrate includes setting a substrate inside a cleaning chamber, supplying on a surface of the substrate a treatment solution which includes a volatile component and forms a treatment film, vaporizing the volatile component of the treatment solution supplied on the surface of the substrate such that the treatment solution solidifies or is cured on the surface of the substrate and the treatment film is formed on the surface of the substrate, and supplying onto the treatment film formed on the surface of the substrate a removal solution which removes the treatment film.

20 Claims, 14 Drawing Sheets

(51) Int. Cl.
　　　*H01L 21/687*　　(2006.01)
　　　*B08B 3/08*　　　(2006.01)
(52) U.S. Cl.
　　　CPC .... *H01L 21/02057* (2013.01); *H01L 21/6708* (2013.01); *H01L 21/6715* (2013.01); *H01L 21/67051* (2013.01); *H01L 21/68728* (2013.01)

(56)　　　　　　References Cited

U.S. PATENT DOCUMENTS

| | | | | |
|---|---|---|---|---|
| 5,635,053 | A * | 6/1997 | Aoki | B08B 3/08 134/109 |
| 6,558,233 | B1 * | 5/2003 | Matsuoka | H01L 21/02024 257/E21.228 |
| 7,458,762 | B2 | 12/2008 | Han et al. | |
| 8,023,099 | B2 | 9/2011 | Yamamoto | |
| 2003/0165756 | A1 * | 9/2003 | Ono | G03D 5/00 430/30 |
| 2007/0017555 | A1 * | 1/2007 | Sekiguchi | B08B 3/02 134/33 |
| 2008/0153040 | A1 * | 6/2008 | Honda | G03F 7/423 430/319 |
| 2009/0015804 | A1 * | 1/2009 | De Jong | B08B 3/12 355/30 |
| 2009/0205684 | A1 | 8/2009 | Orii et al. | |
| 2012/0214294 | A1 * | 8/2012 | Kon | C11D 7/5013 438/478 |

FOREIGN PATENT DOCUMENTS

| | | |
|---|---|---|
| JP | 2002-359221 A | 12/2002 |
| JP | 2007-258462 A | 10/2007 |
| JP | 2008-060368 | 3/2008 |
| JP | 2010-186901 A | 8/2010 |
| JP | 2012-174775 A | 9/2012 |
| JP | 2013-016599 A | 1/2013 |
| JP | 2014-017466 A | 1/2014 |
| KR | 2005-0070681 | 7/2005 |

\* cited by examiner

SUBSTRATE CLEANING APPARATUS, SUBSTRATE CLEANING SYSTEM, SUBSTRATE CLEANING METHOD AND MEMORY MEDIUM

CROSS-REFERENCE RELATED APPLICATIONS

The present application is a divisional of and claims the benefit of priority to U.S. application Ser. No. 13/961,110, filed Aug. 7, 2013, which is based upon and claims the benefit of priority to Japanese Patent Applications No. 2012-175417, filed Aug. 7, 2012; No. 2012-229166, filed Oct. 16, 2012; and No. 2013-095996, filed Apr. 30, 2013. The entire contents of these applications are incorporated herein by reference.

BACKGROUND OF THE INVENTION

Field of the Invention

The present invention relates to a substrate cleaning apparatus, a substrate cleaning system, a substrate cleaning method and a memory medium.

Description of Background Art

As for a substrate cleaning apparatus to remove particles attached to substrates such as silicon wafers and compound semiconductor wafers, there is a type which removes particles by physical force generated when a flowing substance such as liquid or gas is supplied onto substrate surfaces (see Japanese Patent Publication No. H08-318181). There is another type in which a chemical solution such as SC1 is provided onto substrate surfaces so that particles are removed through chemical reactions (such as etching) of the supplied solution (see Japanese Patent Publication No. 2007-258462). The entire contents of these publications are incorporated herein by reference.

SUMMARY OF THE INVENTION

According to one aspect of the present invention, an apparatus for cleaning a substrate includes a cleaning chamber which accommodates a substrate inside the cleaning chamber, a treatment solution supply device which supplies a treatment solution having a volatile component and capable of solidifying or being cured to form a treatment film through vaporization of the volatile component, and a removal solution supply device which supplies a removal solution capable of removing the treatment film formed on a surface of the substrate. The treatment solution supply device supplies the treatment solution on the surface of the substrate set inside the cleaning chamber, and the removal solution supply device supplies the removal solution onto the treatment film formed on the surface of the substrate.

According to another aspect of the present invention, a substrate cleaning system includes a substrate cleaning apparatus which cleans a substrate, and a control apparatus which controls the substrate cleaning apparatus. The substrate cleaning apparatus has a cleaning chamber which accommodates the substrate inside the cleaning chamber, a treatment solution supply device which supplies a treatment solution including a volatile component and capable of solidifying or being cured to form a treatment film through vaporization of the volatile component, and a removal solution supply device which supplies a removal solution capable of removing the treatment film formed on a surface of the substrate, the treatment solution supply device supplies the treatment solution on the surface of the substrate set inside the cleaning chamber, the removal solution supply device supplies the removal solution onto the treatment film formed on the surface of the substrate, and the control apparatus controls the treatment solution supply device such that the treatment solution supply device supplies a sufficient amount of the treatment solution to clean the surface of the substrate set inside the cleaning chamber and the removal solution supply device such that the removal solution supply device supplies a sufficient amount of the removal solution to remove the treatment film from the substrate after the treatment film is formed by solidifying or curing the treatment solution on the surface of the substrate.

According to yet another aspect of the present invention, a method for cleaning a substrate includes setting a substrate inside a cleaning chamber, supplying on a surface of the substrate a treatment solution which includes a volatile component and forms a treatment film, vaporizing the volatile component of the treatment solution supplied on the surface of the substrate such that the treatment solution solidifies or is cured on the surface of the substrate and the treatment film is formed on the surface of the substrate, and supplying onto the treatment film formed on the surface of the substrate a removal solution which removes the treatment film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
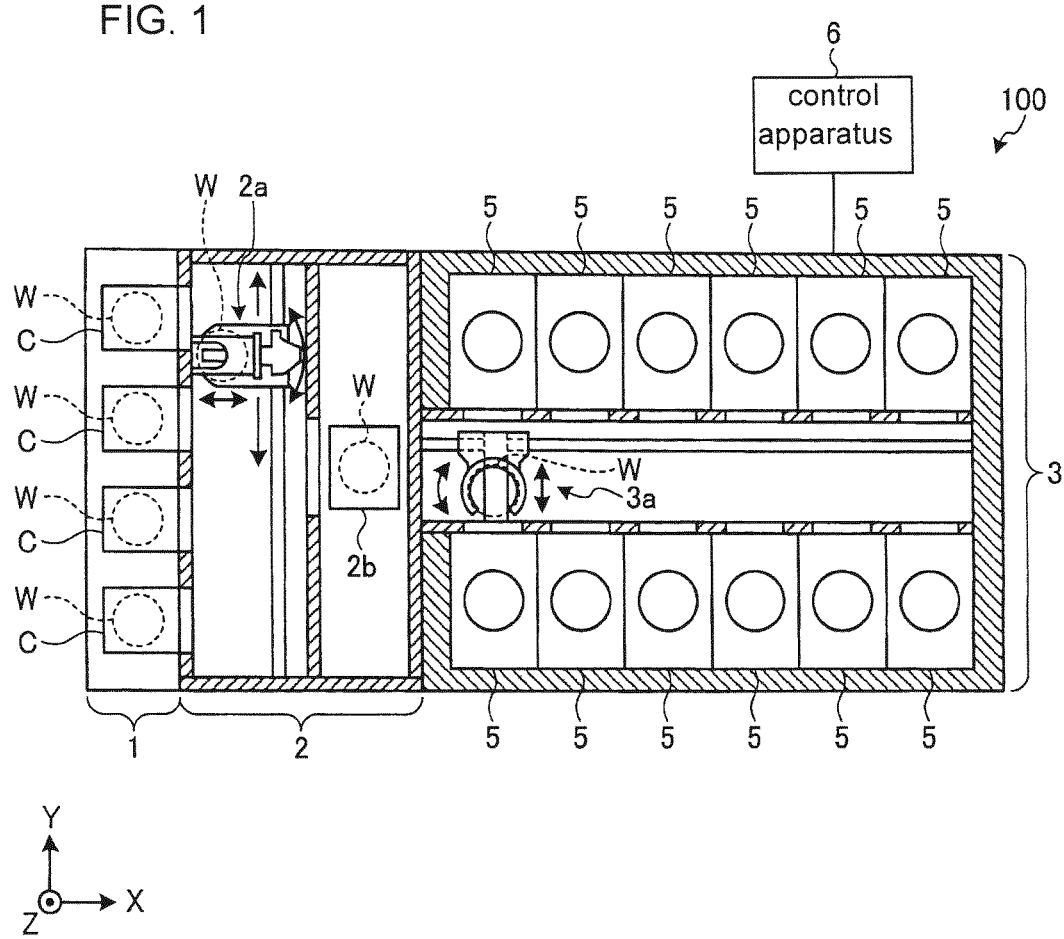
FIG. 1 is a view showing a schematic diagram of a substrate cleaning system according to a first embodiment.

The embodiments will now be described with reference to the accompanying drawings, wherein like reference numerals designate corresponding or identical elements throughout the various drawings.

First Embodiment

Structure of Substrate Cleaning System

The schematic structure of a substrate cleaning system according to a first embodiment is described with reference to FIG. 1. FIG. 1 schematically shows the structure of a substrate cleaning system of the first embodiment.

In the following, to clarify positional relationships, axes (X, Y, Z) orthogonal to each other are determined, and a positive Z direction is set to be perpendicular upward to the XY plane. In addition, a negative X direction is set toward the front of a substrate cleaning system, and a positive X direction is set toward the rear of the substrate cleaning system in the following.

As shown in FIG. 1, substrate cleaning system 100 has loading/unloading station 1, transfer station 2 and processing station 3. Loading/unloading station 1, transfer station 2 and processing station 3 are set in position from the front toward the rear of substrate cleaning system 100 in the order of loading/unloading station 1, transfer station 2 and processing station 3.

Loading/unloading station 1 is where carriers (C) are provided to horizontally accommodate multiple (25, for example) wafers (W). For example, four carriers (C) are provided side by side while being positioned immediately adjacent to the front wall of transfer station 2.

Transfer station 2 is positioned in the rear of loading/unloading station 1, and has substrate transfer device (2a) and substrate delivery table (2b). In transfer station 2, substrate transfer device (2a) transfers wafer (W) between carrier (C) in loading/unloading station 1 and substrate delivery table (2b).

Processing station 3 is positioned in the rear of transfer station 2. In processing station 3, substrate transfer device (3a) is provided in the central section. On both sides of substrate transfer device (3a), multiple substrate cleaning apparatuses 5 are arrayed (here, six each) in a direction from front to rear. In processing station 3, substrate transfer device (3a) transfers one wafer (W) at a time between substrate delivery table (2b) of transfer station 2 and substrate cleaning apparatus 5, and each substrate cleaning apparatus 5 performs a substrate cleaning process on one wafer (W) at a time.

Substrate cleaning system 100 has control apparatus 6, which controls operations in a substrate cleaning system. Control apparatus 6 is a computer, for example, and has a control section and a memory section, which are not shown in the drawings. The memory section stores programs to control various processes such as a substrate cleaning process. The control apparatus controls operations in substrate cleaning system 100 by reading and executing the program stored in the memory section.

Such a program may also be stored in a memory medium readable by a computer, and installed from the memory medium into the memory section of control apparatus 6. Memory media readable by a computer are a hard disc (HD), flexible disc (FD), compact disc (CD), magneto-optical disc (MO), memory card and the like.

For simplicity purposes, FIG. 1 shows an example in which control apparatus 6 is provided outside substrate cleaning system 100. However, control apparatus 6 may also be provided inside substrate cleaning system 100. For example, it is an option to accommodate control apparatus 6 in a space above substrate cleaning apparatuses 5.

In substrate cleaning system 100 structured as above, substrate transfer device (2a) of transfer station 2 picks up one wafer (W) from carrier (C) provided in loading/unloading station 1 and places the wafer (W) onto substrate delivery table (2b). Wafer (W) on substrate delivery table (2b) is transferred by substrate transfer device (3a) of processing station 3, and is loaded onto any one of substrate cleaning apparatuses 5.

After cleaning treatment is performed by substrate cleaning apparatus 5 on wafer (W) loaded in substrate cleaning apparatus 5, wafer (W) is unloaded from substrate cleaning apparatus 5 by substrate transfer device (3a), and is returned to substrate delivery table (2b). The treated wafer (W) on substrate delivery table (2b) is returned to carrier (C) by substrate transfer device (2a).

In a conventional substrate cleaning apparatus, particles are removed using physical force or using chemical reactions of chemical solutions. However, when conventional techniques are employed, problems may arise; for example, patterns formed on a wafer surface may collapse because of physical force, or the base film of a wafer may be eroded by etching or the like.

Instead of using conventional techniques, substrate cleaning apparatus 5 according to the first embodiment uses change in the volume of a treatment solution for particle removal so that particles attached to wafer (W) are removed, and pattern collapse or base film erosion is suppressed.

Substrate Cleaning Method

Figure 2A:
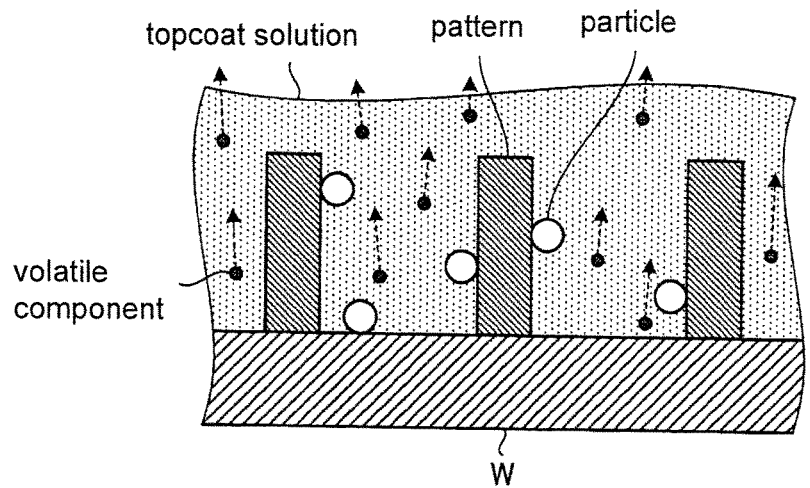
FIG. 2A is a view illustrating a substrate cleaning method.
Figure 2B:
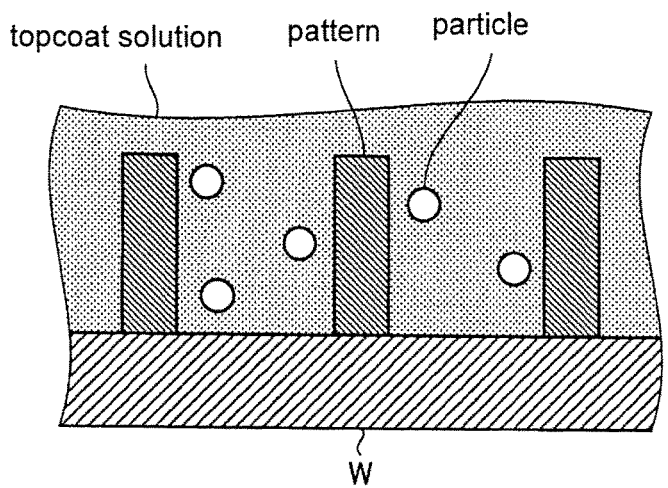
FIG. 2B is a view illustrating a substrate cleaning method.
Figure 2C:
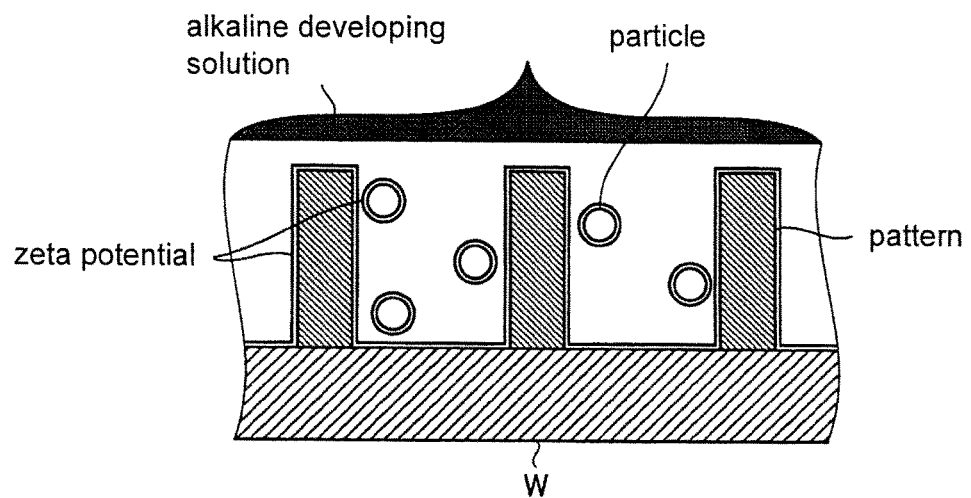
FIG. 2C is a view illustrating a substrate cleaning method.

A substrate cleaning method performed by substrate cleaning apparatus 5 of the first embodiment is described in detail with reference to FIG. 2A~FIG. 2C. FIGS. 2A~2C are views to describe the substrate cleaning method.

As shown in FIG. 2A, a treatment solution that contains a volatile component and forms a film on wafer (W) is used (hereinafter referred to as a "film-forming treatment solution") in the first embodiment. In particular, a film-forming treatment solution to form a topcoat film on wafer (W) is used (hereinafter referred to as a "topcoat solution"). Here, a topcoat film is a protective film applied on an upper surface of a resist film to prevent the infiltration of an immersion solution into the resist film. An immersion solution is used for exposure in immersion lithography, for example.

As shown in FIG. 2A, substrate cleaning apparatus 5 supplies a topcoat solution on wafer (W). The volume of topcoat solution supplied on wafer (W) contracts when the volatile component contained in the solution is vaporized. Moreover, since the topcoat solution contains acrylic resin characterized by volume contraction when it is hardened or cured, the volume of the topcoat solution also contracts because of curing contraction of the acrylic resin. Here, "hardened" means the resin is solidified, and "cured" means molecules are bonded to be polymers (for example, cross linking or polymerization).

The topcoat solution is hardened or cured as its volume contracts, and forms a topcoat film. During that time, because of strain caused by the volume contraction of the topcoat solution (tensile force), particles attached to patterns or the like are removed from the patterns or the like (see FIG. 2B).

Because of volume contraction that occurs in a topcoat solution through vaporization of the volatile component and curing contraction of acrylic resin, the volume contraction rate is greater than that of film-forming treatment solutions that contain only volatile component. Thus, particles are removed by stronger force. Especially, since acrylic resin shows greater curing contraction than other resins such as epoxy resin, it is effective for a topcoat solution to contain acrylic resin because tensile force is generated to be exerted on particles.

Substrate cleaning apparatus 5 removes the entire topcoat film from wafer (W) by supplying a removal solution onto the topcoat film so that the topcoat film is dissolved. Accordingly, particles are also removed with the topcoat film from wafer (W).

A topcoat film swells when it is dissolved by a removal solution. Thus, according to the substrate cleaning method of the first embodiment, in addition to the volume contraction due to vaporization of the topcoat film, volume expansion caused by swelling of the topcoat film also works on particles so that the particles are removed from patterns or the like by stronger force.

In the first embodiment, particles are removed using the change in volume of a film-forming treatment solution. Compared with conventional methods for removing particles using physical force, since particles are removed by weaker force according to the present embodiment, pattern collapse is suppressed. In addition, since particles are removed without using chemical reactions, erosion of base film due to etching or the like is also suppressed. Therefore, according to the substrate cleaning method of the first embodiment, particles attached to wafer (W) are removed, and pattern collapse or base film erosion is suppressed. The entire topcoat film formed on wafer (W) is removed without exposure to light for pattern forming.

According to the substrate cleaning method of the first embodiment, it is easier to remove small-diameter particles and particles that have penetrated into spaces between patterns, which were difficult to remove by substrate cleaning methods using physical force.

In the first embodiment, alkaline removal solutions are used to enhance the efficiency of removing particles. In particular, alkaline developing solutions are used as removal solutions. Alkaline developing solutions are not limited to any specific type, as long as they contain at least one of ammonium, tetramethyl ammonium hydroxide (TMAH) and choline-based solutions.

When an alkaline developing solution is supplied, surfaces of wafer (W) and patterns are charged with zeta potential of the same polarity (here, it is negative) as that on surfaces of particles as shown in FIG. 2C. The particles removed from wafer (W) and the like due to a change in volume of the topcoat solution will repel wafer (W) and the like when the particles are charged with zeta potential of the same polarity as that on wafer (W) and the like. Accordingly, the particles are prevented from reattaching to wafer (W) and the like.

After particles are removed from wafer (W) and the like using volume contraction of a topcoat solution, an alkaline developing solution is supplied so that the topcoat film is dissolved, while wafer (W) and the like are charged with zeta potential of the same polarity as that on particles. Accordingly, reattachment of particles is prevented, and the efficiency of removing particles is further enhanced.

The film-forming solution such as a topcoat solution supplied to wafer (W) ultimately will be entirely removed from wafer (W). Therefore, after cleaning is completed, wafer (W) retains the initial state before the topcoat solution was applied; namely, the surface where circuits are formed is exposed.

Structure and Operations of Substrate Cleaning Apparatus

The structure and operations of substrate cleaning apparatus 5 of the first embodiment are described in detail.

Figure 3:
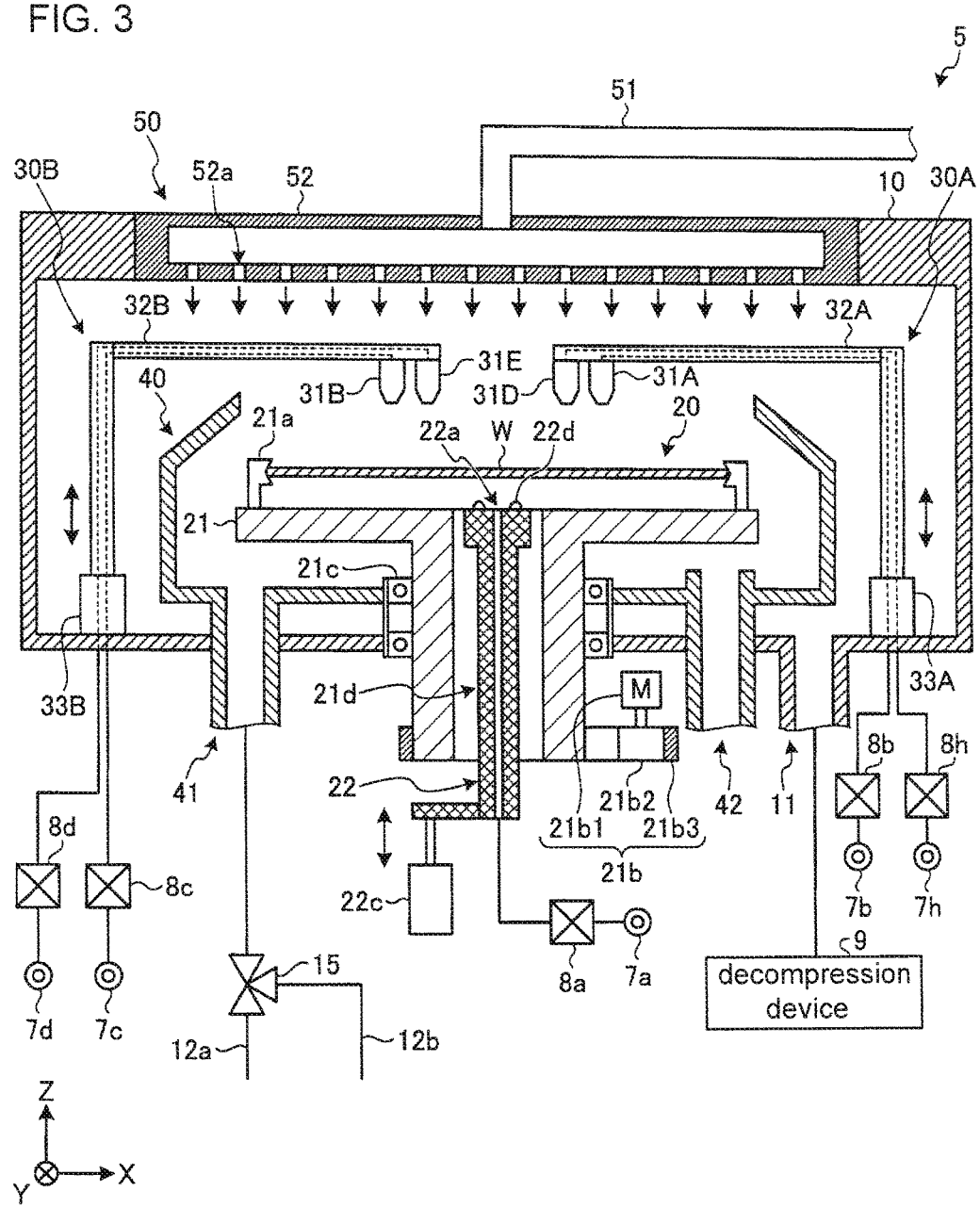
FIG. 3 is a view schematically showing the structure of a substrate cleaning apparatus according to the first embodiment.

FIG. 3 is a schematic view showing the structure of substrate cleaning apparatus 5 according to the first embodiment. FIG. 3 shows only the elements necessary to describe the characteristics of substrate cleaning apparatus 5, and general elements are omitted from the drawing.

As shown in FIG. 3, substrate cleaning apparatus 5 has substrate holding section 20, solution supply sections (30A, 30B), collection cup 40 and airflow forming unit 50 in chamber 10.

Substrate holding section 20 is equipped with rotatable holding mechanism 21 to hold wafer (W) while allowing wafer (W) to rotate, and gas supply portion 22 inserted into hollow portion (21d) of rotatable holding mechanism 21 to supply gas to the lower surface of wafer (W).

Rotatable holding mechanism 21 is provided in substantially the center of chamber 10. On the top surface of rotatable holding mechanism 21, holder portion (21a) is provided to hold wafer (W) by its sides. Wafer (W) is horizontally held by holder portion (21a) so that it is separated slightly from the top surface of rotatable holding mechanism 21. Holder portion (21a) is an example of a holding mechanism to hold the periphery of wafer (W).

Rotatable holding mechanism 21 is equipped with driver mechanism (21b) and is rotated around the vertical axis by driver mechanism (21b). In particular, driver mechanism (21b) has motor (21b1), pulley (21b2) attached to the output axis of motor (21b1), and belt (21b3) wound on the periphery of pulley (21b2) and rotatable holding mechanism 21.

Driver mechanism (21b) rotates pulley (21b2) when motor (21b1) is running. Rotation of pulley (21b2) is transferred to rotatable holding mechanism 21 by belt (21b3) so that rotatable holding mechanism 21 rotates around the vertical axis. When rotatable holding mechanism 21 rotates, wafer (W) held by rotatable holding mechanism 21 also rotates with rotatable holding mechanism 21. Rotatable holding mechanism 21 is supported by bearing (21c) so as to be rotatable in collection cup 40 and in chamber 10.

Gas supply portion 22 is a long member inserted into hollow portion (21d) formed in the center of rotatable holding mechanism 21. Channel (22a) is formed in gas supply portion 22. N2 gas supply source (7a) is connected to channel (22a) through valve (8a). Gas supply portion 22 supplies N2 gas provided from N2 gas supply source (7a) to the lower surface of wafer (W) through valve (8a) and channel (22a).

N2 gas supplied through valve (8a) is high-temperature N2 gas (approximately 90° C., for example) and is used in a vaporization acceleration step as described later.

Gas supply portion 22 is also used to transfer wafer (W). More specifically, at the base of gas supply portion 22, elevator mechanism (22c) is provided to vertically move gas supply portion 22. In addition, support pin (22d) to support wafer (W) is provided on the upper surface of gas supply portion 22.

When substrate holding section 20 receives wafer (W) from substrate transfer device (3a) (see FIG. 1), gas supply portion 22 is elevated by elevator mechanism (22c) and wafer (W) is put on the upper portion of support pin (22d). Then, gas supply portion 22 is lowered to a predetermined position in substrate holding section 20 so that wafer (W) is transferred to holder portion (21a) of rotatable holding mechanism 21. In addition, when substrate holding section 20 returns treated wafer (W) to substrate transfer device (3a), gas supply portion 22 is elevated by elevator mechanism (22c) so that wafer (W) supported by holder portion (21a) is placed on support pin (22d). Then, substrate holding section 20 returns wafer (W) on support pin (22d) to substrate transfer device (3a).

Solution supply sections (30A, 30B) move from a position off wafer (W) to a position above wafer (W), and treatment solutions are supplied onto the upper surface of wafer (W) held by substrate holding section 20. Solution supply section (30A) has nozzles (31A, 31D), arm (32A) to horizontally support nozzles (31A, 31D), and oscillating elevator mechanism (33A) to rotate, elevate and lower arm (32A). Solution supply section (30B) has nozzles (31B, 31E), arm (32B) to horizontally support nozzles (31B, 31E), and oscillating elevator mechanism (33B) to rotate, elevate and lower arm (32B).

Solution supply section (30A) supplies from nozzle (31A) a topcoat solution as a film-forming treatment solution to wafer (W) while supplying from nozzle (31D) MIBC (4-methyl-2-pentanol) as a solvent having affinity properties with the topcoat solution. More specifically, film-forming treatment solution supply source (7b) is connected to nozzle (31A) via valve (8b). A topcoat solution, provided from film-forming treatment solution supply source (7b), is supplied from nozzle (31A) onto wafer (W). In addition, solvent supply source (7h) is connected to nozzle (31D) (corresponding to a "solvent supply section") via valve (8h). MIBC, provided from solvent supply source (7h), is supplied from nozzle (31D) onto wafer (W).

MIBC is contained in a topcoat solution, and has affinity properties with the topcoat solution. Other than MIBC, it is an option to use solvents having affinity properties with a topcoat solution, for example, PGME (propylene glycol monomethyl ether), PGMEA (propylene glycol monomethyl ether acetate) or the like.

Solution supply section (30B) supplies an alkaline developing solution as a removal solution from nozzle (31B) onto wafer (W), and supplies from nozzle (31E) CDIW for rinsing treatment. More specifically, removal solution supply source (7c) is connected to nozzle (31B) via valve (8c). An alkaline developing solution provided from removal solution supply source (7c) is supplied onto wafer (W) from nozzle (31B). In addition, CDIW supply source (7d) is connected to nozzle (31E) via valve (8d). CDIW provided from CDIW supply source (7d) is supplied onto wafer (W) from nozzle (31E). CDIW is pure water at room temperature (approximately 23~25° C.).

Here, nozzles (31A, 31D, 31B, 31E) are provided exclusively for their respective treatment solutions. However, one nozzle may be used for multiple types of solutions. For example, it is an option to set one nozzle on arm (32A) (see FIG. 3), and to selectively switch the supply from that nozzle between a topcoat solution and MIBC. In the same manner, it is an option to set one nozzle on arm (32B), and to selectively switch the supply from that nozzle between an alkaline developing solution and CDIW. However, if a nozzle is shared by multiple types of solutions, it is necessary to drain any treatment solution remaining in the nozzle or pipe to avoid mixing different treatment solutions. Thus, treatment solutions are wasted. By contrast, when nozzles (31A, 31D, 31B, 31E) are provided exclusively for their respective solutions, there is no need to conduct a step for draining treatment solutions described above, and treatment solutions will not be wasted.

Collection cup 40 is positioned to surround rotatable holding mechanism 21 to prevent treatment solutions from being sputtered. Drain port 41 is formed at the bottom of collection cup 40, and treatment solution collected in collection cup 40 is drained from substrate cleaning apparatus 5 through drain port 41. In addition, exhaust port 42 is formed at the bottom of collection cup 40, and N2 gas supplied from gas supply portion 22, or gas supplied from gas-forming unit 50 to substrate cleaning apparatus 5, is discharged from substrate cleaning apparatus 5 through exhaust port 42.

Drain line (12a) and collection line (12b) are provided for drain port 41. Lines (12a, 12b) are switchable using diverter valve 15. By switching lines (12a, 12b) using diverter valve 15, substrate cleaning apparatus 5 drains the topcoat solution removed from wafer (W) through drain line (12a), and drains the recyclable alkaline developing solution to collection line (12b).

Exhaust port 11 is formed at the bottom of chamber 10, and decompression device 9 is connected to exhaust port 11. Decompression device 9 is a vacuum pump, for example, and pumps out air from chamber 10 to reduce the pressure.

Current forming unit 50 is installed on the ceiling of chamber 10 and generates downflow current in chamber 10. More specifically, current forming unit 50 has downflow gas supply pipe 51 and buffer room 52 connected to downflow gas supply pipe 51. Downflow gas supply pipe 51 is connected to the downflow gas supply source (not shown). At the bottom of buffer room 52, multiple connection holes (52a) are formed to connect buffer room 52 and chamber 10.

Current forming unit 50 supplies downflow gas (clean gas, dry gas, etc.) to buffer room 52 via downflow gas supply pipe 51. Through multiple connection holes (52a), current forming unit 50 supplies chamber 10 with the downflow gas provided to buffer room 52. Accordingly, downflow current is formed in chamber 10. Downflow gas in chamber 10 is discharged from drain port 42 and exhaust port 11 to the outside of substrate cleaning apparatus 5.

Figure 4:
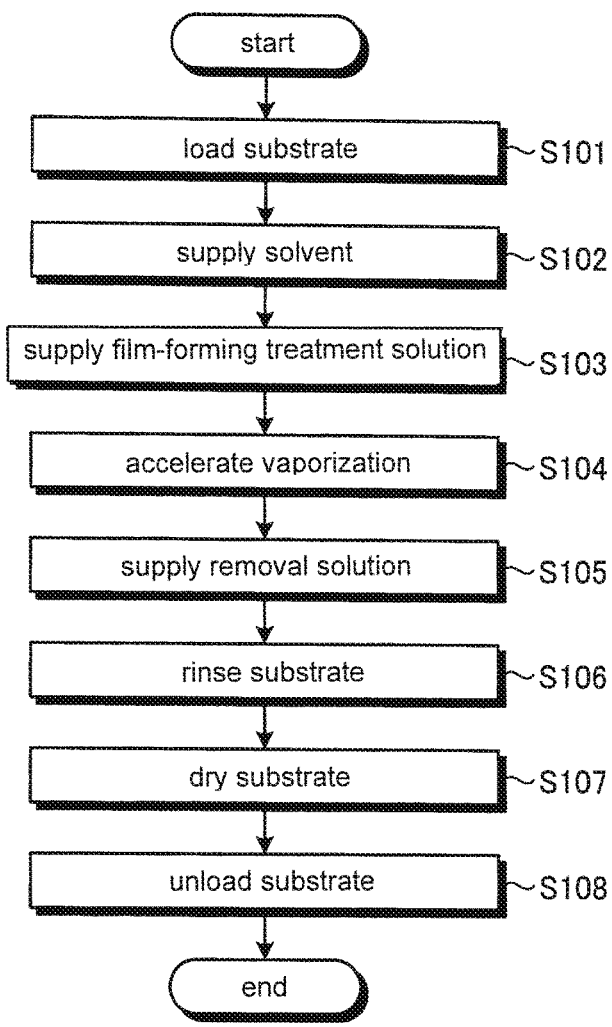
FIG. 4 is a flowchart showing the steps of a substrate cleaning process performed by a substrate cleaning apparatus.
Figure 5A:
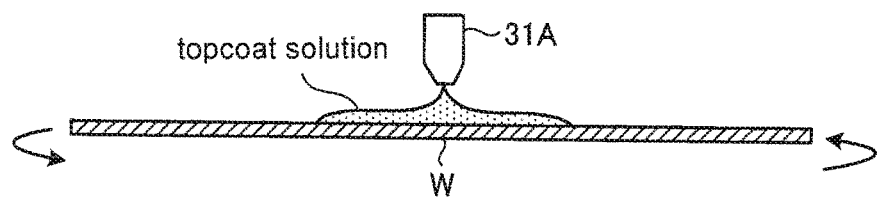
FIG. 5A is a view illustrating an operation performed by a substrate cleaning apparatus.
Figure 5B:
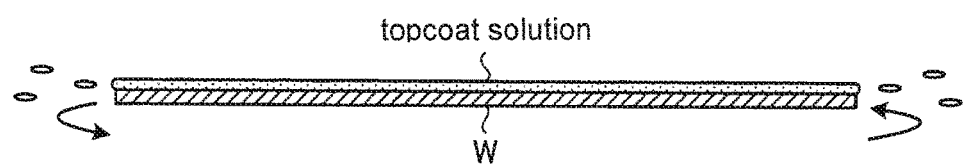
FIG. 5B is a view illustrating an operation performed by a substrate cleaning apparatus.
Figure 5C:
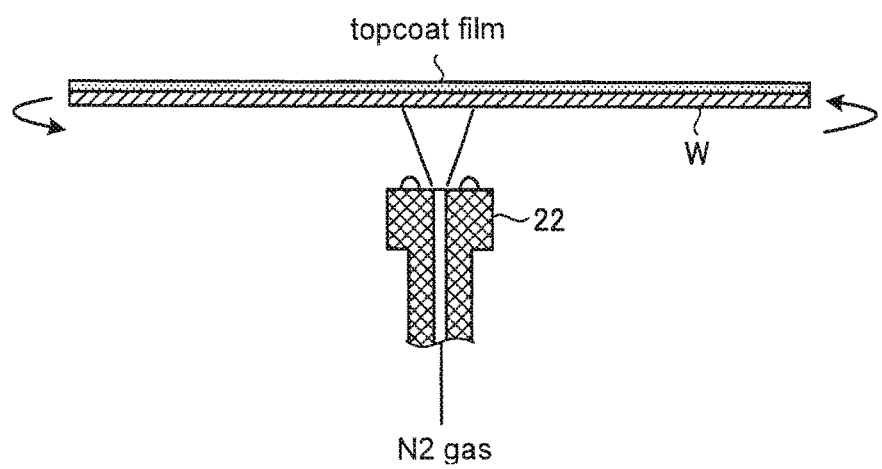
FIG. 5C is a view illustrating an operation performed by a substrate cleaning apparatus.
Figure 5D:
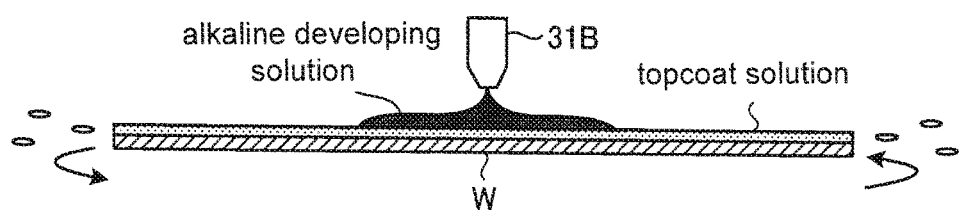
FIG. 5D is a view illustrating an operation performed by a substrate cleaning apparatus.
Figure 5E:
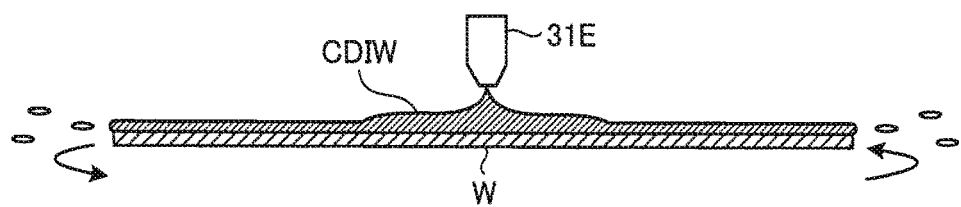
FIG. 5E is a view illustrating an operation performed by a substrate cleaning apparatus.
Figure 5F:
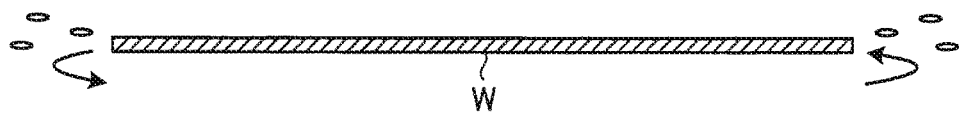
FIG. 5F is a view illustrating an operation performed by a substrate cleaning apparatus.

Specific operations of substrate cleaning apparatus 5 are described. FIG. 4 is a flowchart showing the steps of a substrate cleaning process carried out by substrate cleaning apparatus 5. Also, FIGS. 5A-5F are views illustrating operations performed by substrate cleaning apparatus 5. In particular, FIGS. 5A and 5B each show a processing example of how a film-forming treatment solution is supplied to a wafer (step (S103) in FIG. 4), and FIG. 5C shows a processing example of how vaporization is accelerated (step (S104) in FIG. 4). FIG. 5D shows a processing example of how a removal solution is supplied (step (S105) in FIG. 4), and FIG. 5E shows a processing example of how the wafer is rinsed (step (S106) in FIG. 4). FIG. 5F shows a processing example of how the wafer is dried (step (S107) in FIG. 4). Each step in FIG. 4 is performed according to commands from control apparatus 6.

As shown in FIG. 4, first, a step for loading a substrate is conducted in substrate cleaning apparatus 5 (step S101). In such a substrate loading step, substrate transfer device (3a) places wafer (W) on support pin (22d) of gas supply portion 22, and wafer (W) is held by holder portion (21a) of rotatable holding mechanism 21. At that time, wafer (W) is held by holder portion (21a) with the circuit-pattern surface facing upward. After that, rotatable holding mechanism 21 is rotated by driver mechanism (21b). Accordingly, wafer (W) also rotates with rotatable holding mechanism 21 while being held horizontally by rotatable holding mechanism 21.

Next, a solvent supply step (step S102) is performed in substrate cleaning apparatus 5. In the solvent supply step, prior to supplying a topcoat solution to wafer (W) as a film-forming solution, MIBC having affinity properties with the topcoat solution is supplied to wafer (W).

In particular, nozzle (31D) of solution supply section (30A) is positioned above the center of wafer (W), and MIBC is supplied onto the upper surface of wafer (W) from nozzle (31D). MIBC supplied onto the upper surface of wafer (W) is spread over the upper surface of wafer (W) by the centrifugal force generated as wafer (W) rotates.

When MIBC, which has affinity properties with a topcoat solution, is spread over wafer (W) in advance, a topcoat solution is more likely to be spread over the upper surface of wafer (W) during the later-described step for supplying a film-forming treatment solution, and the topcoat solution tends to infiltrate into spaces between patterns. Accordingly, particles that have penetrated into spaces between patterns are more certainly removed, and the amount of a topcoat solution to be supplied is reduced. Moreover, the duration for supplying a film-forming treatment solution is shortened.

It is preferable to perform a solvent supply step as described above to efficiently spread a topcoat film over the upper surface of wafer (W) in a short period of time. However, a solvent supply step is optional.

In a solvent supply step, drain port 41 of collection cup 40 (see FIG. 3) is connected to collection line (12b). Accordingly, MIBC spun off from wafer (W) due to centrifugal force is drained from drain port 41 of collection cup 40 to collection line (12b) through diverter valve 15.

A step for supplying a film-forming treatment solution is performed in substrate cleaning apparatus 5 (step S103). Nozzle (31A) of solution supply section (30A) is positioned above the center of wafer (W) in the step for supplying a film-forming treatment solution. Then, as shown in FIG. 5A, a topcoat solution as a film-forming treatment solution is supplied from nozzle (31A) onto the upper surface of wafer (W) where circuits are formed without resist film.

The topcoat solution supplied on the upper surface of wafer (W) is spread over the upper surface of wafer (W) by centrifugal force generated by the rotation of wafer (W). Accordingly, as shown in FIG. 5B, liquid film of the topcoat is formed on the entire upper surface of wafer (W). When the step for supplying a film-forming treatment solution is completed, nozzle (31A) moves to a position off wafer (W).

In a step for supplying a film-forming treatment solution, drain port 41 of collection cup 40 (see FIG. 3) is connected to drain line (12a). Accordingly, the topcoat solution spun off wafer (W) by centrifugal force is drained from drain port 41 of collection cup 40 to drain line (12a) through diverter valve 15.

In substrate cleaning apparatus 5, a step to accelerate vaporization is performed (step S104). Such a vaporization acceleration step is performed to accelerate vaporization of a volatile component contained in a topcoat solution that forms liquid film on the entire upper surface of wafer (W). More specifically, when valve (8a) (see FIG. 3) opens for a predetermined duration, high-temperature N2 gas is supplied from gas supply portion 22 toward the lower surface of rotating wafer (W) as shown in FIG. 5C. By doing so, wafer (W) and the topcoat solution are heated, accelerating vaporization of the volatile component.

Decompression device 9 (see FIG. 3) reduces the pressure in chamber 10. Such a step also accelerates vaporization of the volatile component. Moreover, downflow gas is supplied from current forming unit 50 during the substrate cleaning process. Downflow gas reduces the humidity level in chamber 10, thus accelerating vaporization of the volatile component.

When the volatile component is vaporized, the topcoat solution is hardened or cured while its volume contracts, and topcoat film is formed. During such time, particles attached to wafer (W) and the like are removed from wafer (W) and the like.

In substrate cleaning apparatus 5, the duration for hardening or curing a film-forming treatment solution is shortened by accelerating vaporization of the volatile component in a film-forming treatment solution. In addition, curing contraction of synthetic resin in the film-forming treatment solution is also accelerated when wafer (W) is heated. Thus, the contraction rate of the film-forming treatment solution is further enhanced, compared with an example when wafer (W) is not heated. Gas supply portion 22, decompression device 9 and current forming unit 50 are examples of a "vaporization acceleration section."

Here, an example was shown in which the vaporization acceleration step is conducted in substrate cleaning apparatus 5. However, it is an option to omit such a vaporization acceleration step. Namely, substrate cleaning apparatus 5 may be put in a standby mode until a topcoat solution is naturally hardened or cured. It is also an option to turn off the rotation of wafer (W) while the topcoat solution is vaporized. Alternatively, the vaporization of a topcoat solution may be accelerated by rotating wafer (W) at a speed that prevents the topcoat solution from being totally shaken off so as not to expose the surface of wafer (W).

Next, a step for supplying a removal solution is performed in substrate cleaning apparatus 5 (step S105). As shown in FIG. 5D, nozzle (31B) is positioned above the center of wafer (W) in such a removal solution supply step. When valve (8c) (see FIG. 3) is open for a predetermined duration, an alkaline developing solution as a removal solution is supplied onto rotating wafer (W) from nozzle (31B) of solution supply section (30B). Accordingly, the topcoat film formed on wafer (W) is dissolved and removed.

During that time, since wafer (W) and the like are charged with zeta potential of the same polarity as that on particles, wafer (W) and the like repel the particles. Thus, reattachment of the particles onto wafer (W) and the like is prevented.

In the removal solution supply step, drain port 41 of collection cup 40 (see FIG. 3) is connected to collection line (12b). Accordingly, the removal solution spun off from wafer (W) due to centrifugal force is drained from drain port 41 of collection cup 40 to collection line (12b) through diverter valve 15. The removal solution drained to collection line (12b) is recycled.

It is an option for drain port 41 to be kept connected to drain line (12a) for a predetermined duration from when the supply of a removal solution is started until the topcoat film is removed, and then to be switched to collection line (12b). In so setting, the topcoat solution is prevented from being mixed into the removal solution to be recycled.

Next, a step for rinsing the upper surface of wafer (W) is performed by substrate cleaning apparatus 5 using CDIW (step S106). In such a rinsing step, as shown in FIG. 5E, nozzle (31E) is positioned above the center of wafer (W). Then, valve (8d) (see FIG. 3) is open for a predetermined duration, and CDIW is supplied onto the upper surface of rotating wafer (W) from nozzle (31E) of solution supply section (30B). Accordingly, the topcoat film and the alkaline developing solution remaining on wafer (W) are rinsed off.

More specifically, CDIW supplied onto wafer (W) is spun off from wafer (W) while being spread over wafer (W) due to the rotation of wafer (W). During such a rinsing step, particles floating in the dissolved topcoat solution or in the alkaline developing solution are removed together with CDIW from wafer (W). During that time, air inside chamber 10 is promptly emitted by downflow current formed by current forming unit 50. When the rinsing step is completed, nozzle (31E) moves to a position off wafer (W).

Next, a drying step is performed in substrate cleaning apparatus 5 (step S107). In the drying step, the rotation speed of wafer (W) is increased for a predetermined duration so that CDIW remaining on the upper surface of wafer (W) is spun off, and wafer (W) is dried (see FIG. 5F). Then, the rotation of wafer (W) is turned off.

Next, a substrate transfer step is performed in substrate cleaning apparatus 5 (step S108). In a substrate transfer step, gas supply portion 22 is elevated by elevator mechanism (22c) (see FIG. 3), wafer (W) held by holder portion (21a) is placed on support pin (22d). Then, wafer (W) on support pin (22d) is transferred to substrate transfer device (3a). When such a substrate transfer step is finished, the substrate cleaning process on one wafer (W) is completed. Wafer (W) is unloaded from substrate cleaning apparatus 5 with its circuit-pattern surface being exposed.

As described above, substrate cleaning apparatus 5 of the first embodiment has solution supply section (30A) (corresponding to a first solution supply section) and solution supply section (30B) (corresponding to a second solution supply section). Solution supply section (30A) supplies wafer (W) with a topcoat solution, which is a treatment solution that contains a volatile component and forms a film on wafer (W). Solution supply section (30B) supplies an alkaline developing solution, which is a removal solution to entirely dissolve the topcoat solution supplied to wafer (W) by solution supply section (30A) and hardened or cured on wafer (W) when the volatile component is vaporized. Therefore, according to the first embodiment, particles attached onto wafer (W) are removed, and pattern collapse or base film erosion is suppressed.

An alkaline removal solution is used in substrate cleaning apparatus 5 of the first embodiment. Accordingly, wafer (W) and the like are charged with zeta potential of the same polarity as that on particles, thus preventing the particles from reattaching to wafer (W). The efficiency of removing particles is enhanced.

Comparison with Cleaning Method Using Physical Force

Figure 12A:
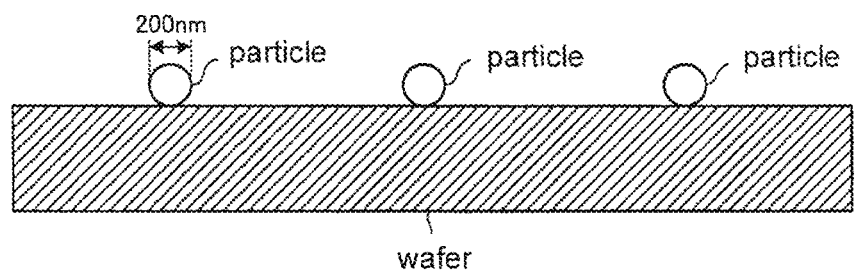
FIG. 12A is a view illustrating conditions for comparing the cleaning method related to an embodiment of the present invention and two-fluid cleaning.
Figure 12B:
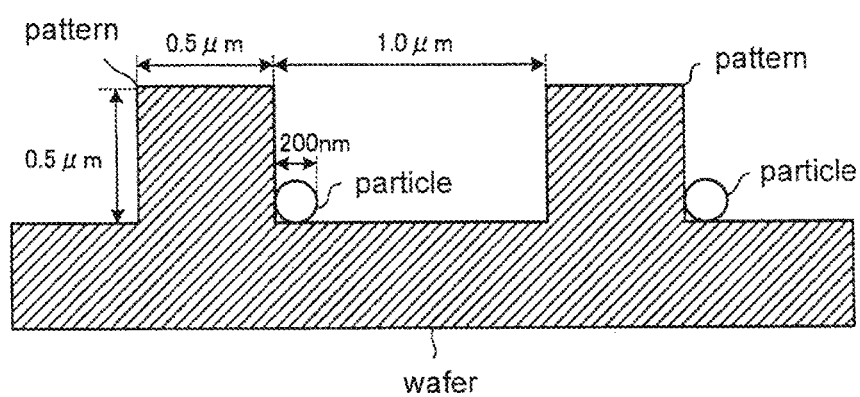
FIG. 12B is a view illustrating conditions comparing the cleaning method related to an embodiment of the present invention and two-fluid cleaning.

Descriptions are provided for comparison results between a two-fluid cleaning method using physical force and the substrate cleaning method according to the first embodiment (hereinafter referred to as "the present cleaning method"). First, comparison conditions are described with reference to FIGS. 12A and 12B. FIGS. 12A and 12B are views illustrating conditions when the present cleaning method and a two-fluid method are compared.

A wafer without patterns (see FIG. 12A) and a wafer with patterns where 0.5 μm-high and 0.5 μm-wide patterns are formed at 1.0 μm pitch (see FIG. 12B) are prepared as shown in FIGS. 12A and 12B, and cleaned by a two-fluid cleaning method and by the present cleaning method. Then, particle removal rates of two cleaning methods are compared. The particle diameter of particles is 200 nm.

Each cleaning method was conducted under both "no-damage condition" and "damage condition." "No-damage condition" indicates that 2 nm-thick thermal oxide film is formed on a wafer, and 100 nm-high and 45 nm-wide sample patterns are formed on the thermal oxide film, and that the wafer is cleaned using force at a predetermined level that does not collapse the sample patterns. Also, "damage condition" indicates that a wafer prepared the same as above is cleaned using force at a predetermined level that would collapse the sample patterns.

Figure 13:
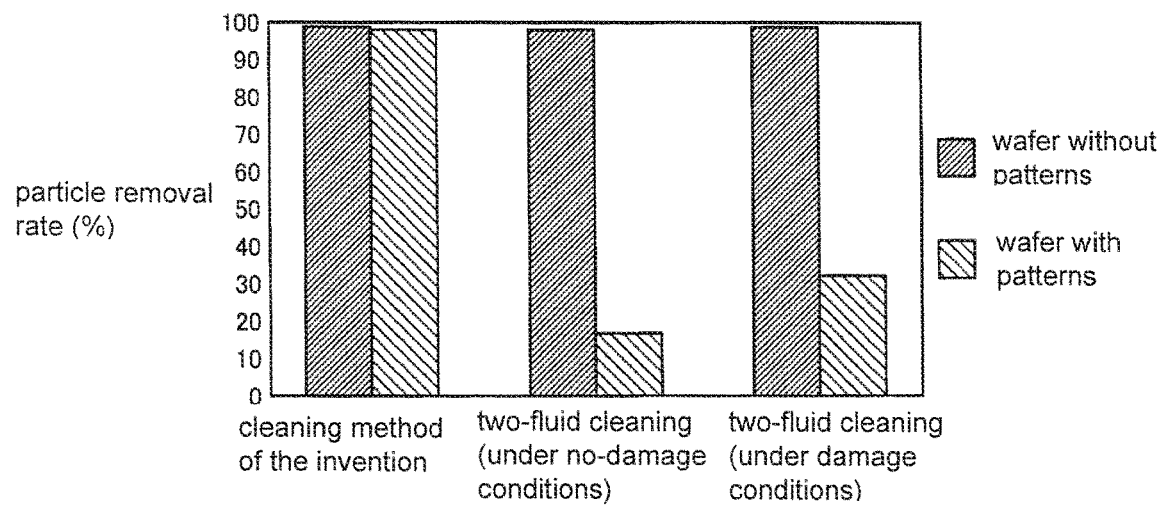
FIG. 13 is a graph showing results of comparing the cleaning method related to an embodiment of the present invention and two-fluid cleaning.

Comparison results are shown in FIG. 13. FIG. 13 is a graph showing the results of comparing the present cleaning method and a two-fluid cleaning method. In FIG. 13, the particle removal rate of a wafer without patterns is shown by a bar with hatching lines sloping to the left, and the particle removal rate of a wafer with patterns is shown by a bar with hatching lines sloping to the right. Sample patterns did not collapse by the present cleaning method. Thus, only the result of "no-damage condition" is shown regarding the present cleaning method.

As shown in FIG. 13, when wafers without patterns were cleaned by the present cleaning method, by a two-fluid method (no-damage condition) and by the two-fluid method (damage condition), particle removal rates were each almost 100%, showing hardly any significant difference between the two cleaning methods.

On the other hand, when wafers with patterns were cleaned, the particle removal rates by a two-fluid cleaning method were approximately 17% under the no-damage condition and approximately 32% under the damage condition, showing a significant reduction from the particle removal rates on wafers without patterns. Since the particle removal rate on a wafer with patterns was lowered significantly from the particle removal rate on a wafer without patterns, it is found that particles that have penetrated into spaces between patterns are difficult to remove using a two-fluid cleaning method.

By contrast, using the present cleaning method, particle removal rates were almost 100% on both a wafer without patterns and a wafer with patterns. Since particle removal rates showed hardly any difference between a wafer without patterns and a wafer with patterns, it is found that particles that have penetrated into spaces between patterns are removed properly by the present cleaning method.

As described, compared with a two-fluid cleaning method, not only are patterns less likely to collapse but particles that have penetrated into spaces between patterns are removed properly using the present cleaning method.

Comparison with Cleaning Method Using Chemical Reactions

Figure 14:
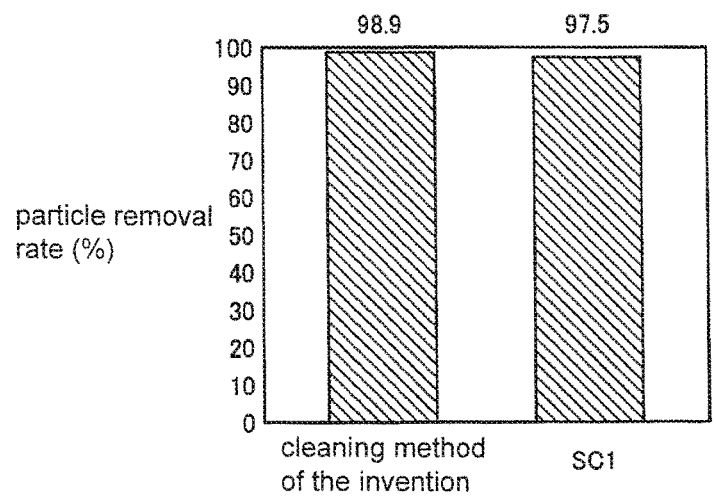
FIG. 14 is a graph showing results of comparing the cleaning method related to an embodiment of the present invention and chemical cleaning.
Figure 15:
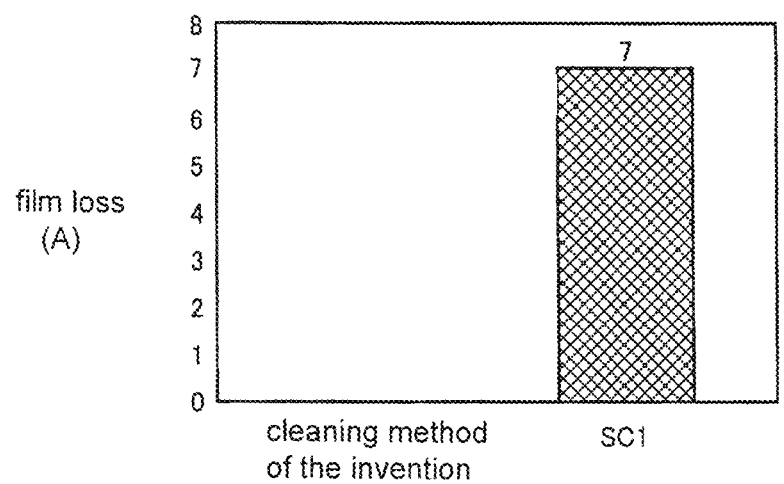
FIG. 15 is a graph showing results of comparing the cleaning method related to an embodiment of the present invention and chemical cleaning.

An SC1 (ammonia-hydrogen peroxide solution) chemical solution cleaning, which is a cleaning method using chemical reactions, is compared with the present cleaning method. FIGS. 14 and 15 are graphs showing comparison results of the present cleaning method and a chemical solution method. FIG. 14 shows comparison results of particle removal rates, and FIG. 15 shows comparison results of film loss. Film loss means the erosion depth of thermal oxide film formed on a wafer as base film.

Chemical solution cleaning uses SC1 prepared by mixing ammonia, water and hydrogen peroxide at a ratio of 1:2:40, and cleaning was conducted at a temperature of 60° C. with a supply duration of 600 seconds. Regarding the present cleaning method, a topcoat solution was supplied, a vaporization acceleration step was conducted and an alkaline developing solution was supplied for 10 seconds. Wafers with patterns shown in FIG. 12B were used.

As shown in FIG. 14, since the particle removal rate by a chemical solution method was 97.5%, which is slightly lower than the particle removal rate by the present cleaning method (98.9%), it is found that particles that had penetrated into spaces between patterns were properly removed, unlike the above-described two-fluid cleaning method.

On the other hand, as shown in FIG. 15, film loss at 7 Å (angstrom) occurred after a chemical solution cleaning, but no film loss was observed by the present cleaning method. As described, it is found that the present cleaning method does not erode base film and removes particles that have penetrated into spaces between patterns.

As found above, according to the present cleaning method, particle collapse or base film erosion is prevented while particles that have penetrated into spaces between patterns are properly removed. Thus, the present cleaning method is more effective than cleaning methods using physical force or chemical reactions.

In substrate cleaning apparatus 5, a film-forming treatment solution may be applied multiple times on wafer (W). For example, it is an option for substrate cleaning apparatus 5 to conduct multiple times a step for supplying a film-forming treatment solution in step (S103) and a step for accelerating vaporization in step (S104) shown in FIG. 4, and then to conduct procedures in step (S105) and in subsequent steps. Alternatively, it is another option for substrate cleaning apparatus 5 to conduct procedures in step (S106) and in subsequent steps after procedures in steps (S102) to (S105) shown in FIG. 4 are repeated multiple times.

Second Embodiment

Figure 6:
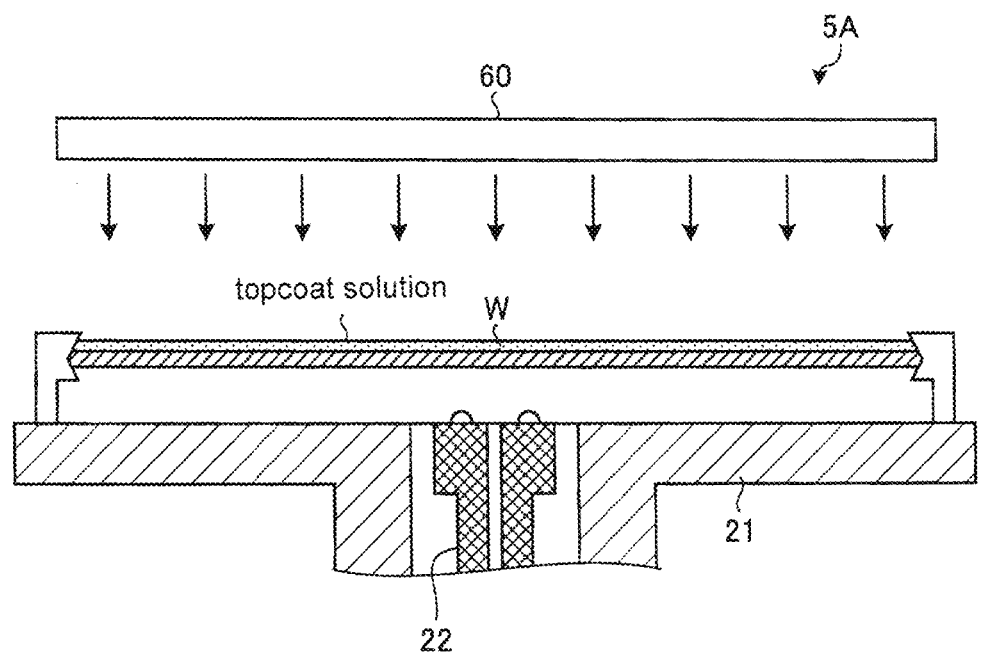
FIG. 6 is a view schematically showing the structure of a substrate cleaning apparatus according to a second embodiment.

In the first embodiment described above, vaporization of the volatile component contained in a topcoat solution was accelerated by heating the topcoat solution, lowering the humidity in chamber 10 and decompressing the air in chamber 10 or the like. However, the vaporization acceleration step is not limited to the above described in the first embodiment. The following provides descriptions of another example of the vaporization acceleration step by referring to FIG. 6. FIG. 6 is a schematic view illustrating the structure of a substrate cleaning apparatus according to a second embodiment. In the following, regarding a portion corresponding to or identical to what was already described above, the same reference number is applied and redundant descriptions are omitted here.

Substrate cleaning apparatus (5A) according to the second embodiment has ultraviolet irradiation section 60 in addition to the same structural elements as those of substrate cleaning apparatus 5 in the first embodiment. UV-ray irradiation section 60 is a UV (ultraviolet) lamp, for example, which is positioned above wafer (W), and irradiates ultraviolet rays onto the upper surface of wafer (W) from above wafer (W). By doing so, the topcoat solution is activated and vaporization of its volatile component is accelerated.

Irradiating UV rays at the topcoat solution in substrate cleaning apparatus (5A) to accelerate vaporization of a volatile component may be conducted as a vaporization accelerating step. UV-ray irradiation section 60 is an example of the vaporization acceleration section.

UV-ray irradiation section 60 is preferred to be positioned higher than nozzles (31A, 31D, 31B, 31E) of solution supply sections (30A, 30B) to avoid interference with procedures performed by solution supply sections (30A, 30B). Alternatively, UV-ray irradiation section 60 may be made movable so as to position it above wafer (W) only when it performs a vaporization acceleration step.

Third Embodiment

Figure 7:
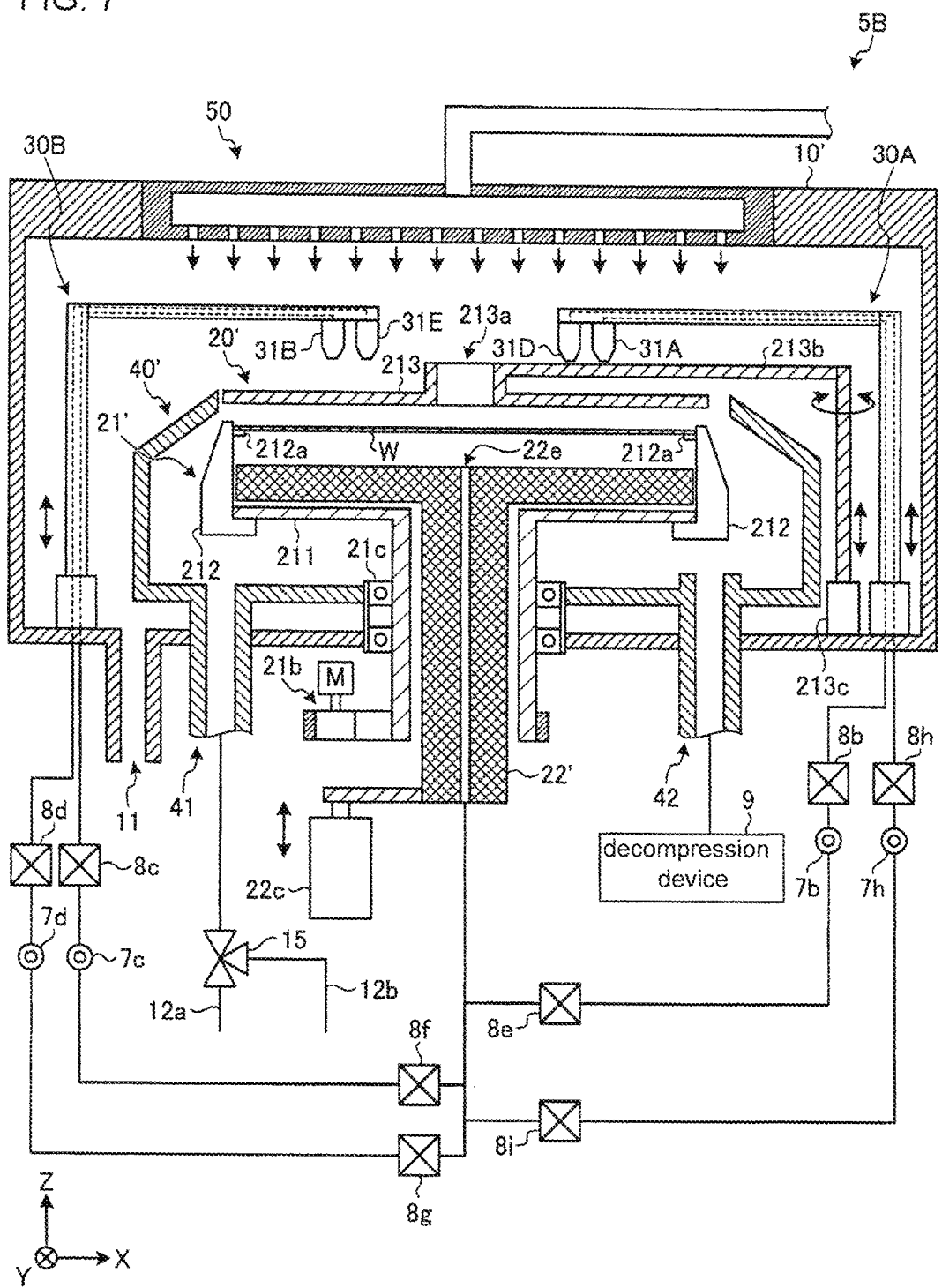
FIG. 7 is a view schematically showing the structure of a substrate cleaning apparatus according to a third embodiment.

The structure of a substrate cleaning apparatus is not limited to those described in the above embodiments. Yet another structure of a substrate cleaning apparatus is described by referring to FIG. 7. FIG. 7 is a schematic view illustrating the structure of a substrate cleaning apparatus according to a third embodiment. In the following, regarding a portion corresponding to or identical to what was already described above, the same reference number is applied and redundant descriptions are omitted here.

As shown in FIG. 7, substrate cleaning apparatus (5B) of the third embodiment has chamber (10'), substrate holding section (20') and collection cup (40') in place of chamber 10, substrate holding section 20 and collection cup 40 in substrate cleaning apparatus 5 of the first embodiment. Moreover, substrate cleaning apparatus (5B) has top plate 213 covering the area above wafer (W) held by holding member 212. Substrate holding section (20') has rotatable holding mechanism (21') that holds wafer (W) while allowing the wafer to rotate, and under plate (22') covering the area beneath wafer (W) held by rotatable holding mechanism (21').

Rotatable holding mechanism (21') has main body 211 through which under plate (22') penetrates, and holding member 212 which is provided to main body 211 and holds wafer (W) so as to be separated from under plate (22').

Holding member 212 has multiple support pins (212a) (three, for example) to support the lower surface of wafer (W). Support pins (212a) support the lower surface of wafer (W) so as to horizontally hold wafer (W). Wafer (W) is supported by support pins (212a) with its circuit-pattern surface facing upward.

Top plate 213 is formed to a size that can cover the upper surface of wafer (W), and opening portion (213a) is formed in the center to flow treatment solutions supplied by solution supply sections (30A, 30B). When treatment solutions are supplied to wafer (W), treatment solutions are supplied in the central portion of wafer (W) from opening portion (213a). Top plate 213 is equipped with arm (213b) to horizontally support top plate 213, and driver mechanism (213c) to oscillate, elevate and lower arm (213b).

When driver mechanism (213c) elevates arm (213b), top plate 213 is also elevated to be away from wafer (W). On the other hand, when driver mechanism (213c) lowers arm (213b), top plate 213 is held to be closer to wafer (W). As described, top plate 213 is set to be movable between a position closer to the upper surface of wafer (W) to cover the area above wafer (W) (hereinafter referred to as "a processing position") and a position away from the upper surface of wafer (W) to open up the area above wafer (W) (hereinafter referred to as "a retraction position").

The same as rotatable holding mechanism 21 of the first embodiment, rotatable holding mechanism (21') is supported by bearing (21c) to be rotatable in chamber (10') and collection cup (40') while it is rotated around the vertical axis by driver mechanism (21b).

Under plate (22') is a member formed to a size that can cover the lower surface of wafer (W) held by rotatable holding mechanism (21'). Channel (22e) is formed in under plate (22'). Channel (22e) is connected to film-forming treatment solution supply source (7b) via valve (8e) while connected to solvent supply source (7h) via valve (8i). Under plate (22') supplies a topcoat solution and MIBC, which are provided respectively from those supply sources, to the lower surface of wafer (W) through channel (22e).

Channel (22e) is connected to CDIW supply source (7d) via valve (8g) while connected to removal solution supply source (7c) via valve (8f). Under plate (22') supplies CDIW and an alkaline developing solution, which are provided respectively from those supply sources, to the lower surface of wafer (W) through channel (22e).

Elevator mechanism (22c) to move under plate (22') vertically is provided at the base end of under plate (22').

Under plate (22') is set to be movable by elevator mechanism (22c) between a position closer to the lower surface of wafer (W) (hereinafter referred to as "a processing position") and a position away from the lower surface of wafer (W) (hereinafter referred to as "a retraction position").

In the third embodiment, decompression device 9 is connected to exhaust port 42 of collection cup (40') instead of exhaust port 11 of chamber 10. Air in a processing space formed by collection cup (40') and top plate 213 in the later-described substrate cleaning step is emitted through exhaust port 42 by decompression device 9 so that the pressure in the processing space is reduced.

Figure 8:
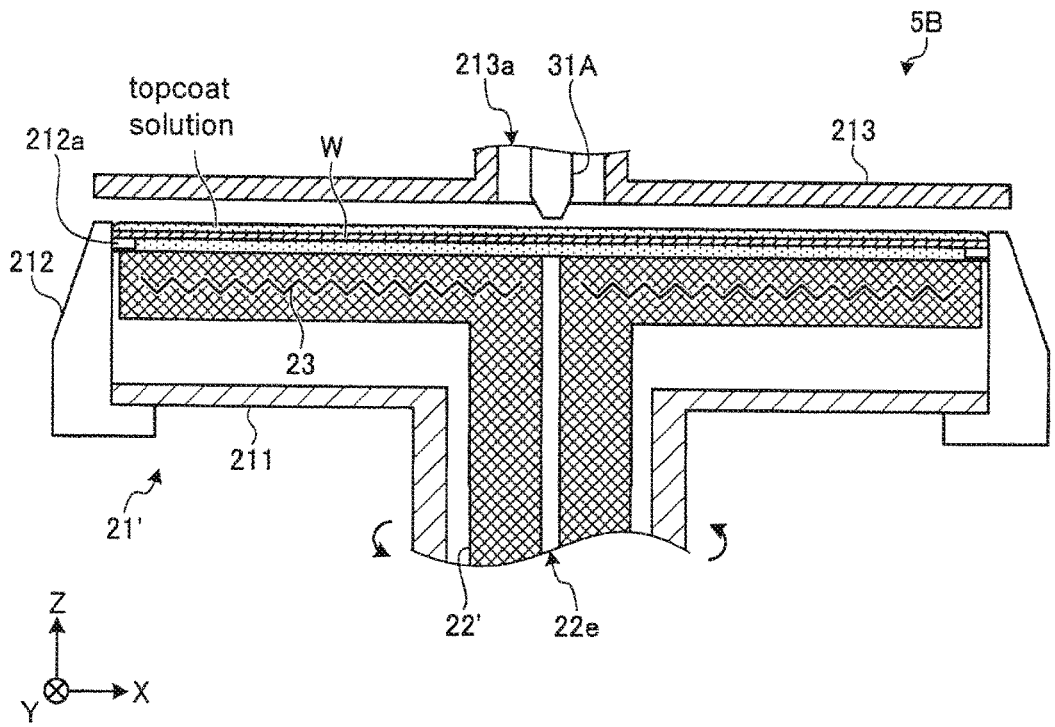
FIG. 8 is a view illustrating an operation performed by a substrate cleaning apparatus according to the third embodiment.

The operations performed by substrate cleaning apparatus (5B) of the third embodiment are described. FIG. 8 is a view illustrating operations of substrate cleaning apparatus (5B) of the third embodiment.

As shown in FIG. 8, top plate 213 and under plate (22') are each positioned for processing. Namely, top plate 213 is positioned closer to the upper surface of wafer (W) covering the area above wafer (W), while under plate (22') is positioned closer to the lower surface of wafer (W). Accordingly, a narrow space of approximately 1 mm is created between top plate 213 and the upper surface of wafer (W) and between under plate (22') and the lower surface of wafer (W).

When body 211 is rotated by driver mechanism (21b) (see FIG. 7), holding member 212 and wafer (W) rotate accordingly. Then, after nozzle (31D) is positioned above the center of wafer (W), MIBC is supplied onto the upper surface of wafer (W) from nozzle (31D), while MIBC is supplied to the lower surface of wafer (W) from under plate (22').

MIBC supplied from nozzle (31D) and under plate (22') is spread toward the periphery of wafer (W) due to the centrifugal force generated as wafer (W) rotates. Accordingly, MIBC forms a puddle on the upper surface of wafer (W) while the space between under plate (22') and the lower surface of wafer (W) is filled with MIBC.

After nozzle (31A) is positioned above the center of wafer (W), a topcoat solution is supplied onto the upper surface of wafer (W) from nozzle (31A), while the topcoat solution is supplied to the lower surface of wafer (W) from under plate (22').

The topcoat solution supplied from nozzle (31A) and under plate (22') is spread toward the periphery of wafer (W) due to the centrifugal force generated as wafer (W) rotates. Accordingly, the topcoat solution forms a puddle on the upper surface of wafer (W) while the space between under plate (22') and the lower surface of wafer (W) is filled with the topcoat solution. When such procedure is finished, nozzle (31A) moves to a position off wafer (W).

Heating portion 23 is provided for under plate (22'), and the vaporization acceleration step of a volatile component is conducted by heating portion 23. Namely, the topcoat solution is heated by heating portion 23. At that time, the heating temperature is 90° C., for example. Accordingly, vaporization of the volatile component contained in the topcoat solution is accelerated. As described, heating portion 23 is an example of a vaporization acceleration section.

As for the vaporization acceleration step, another step is also conducted by decompression device 9 to reduce the pressure in chamber (10'). In the third embodiment, a relatively small processing space is formed by collection cup (40') and top plate 213. The air in such a processing space is emitted by decompression device 9 through exhaust port 42 so that it is easier to reduce the pressure in such processing space.

The downflow gas provided from current forming unit 50 is supplied to the above processing space through opening portion (213a) formed in top plate 213. Therefore, vaporization of volatile component is also accelerated by lowering the humidity in the processing space by such downflow gas. Here, downflow gas was supplied from current forming unit 50, but downflow gas may also be supplied from nozzle (31A) (or nozzle (31B)) of solution supply section (30A) (or solution supply section (30B)).

After nozzle (31B) is positioned above the center of wafer (W), an alkaline developing solution as a removal solution is supplied to the upper and lower surfaces of wafer (W) from nozzle (31B) and under plate (22') respectively. The alkaline developing solution supplied onto wafer (W) is spread over wafer (W) by the rotation of wafer (W), dissolves the topcoat film formed on wafer (W) and is spun off from wafer (W) along with the dissolved topcoat film. During that time, top plate 213 is moved to the retraction position to open up the area above wafer (W) so that the air in chamber (10') is promptly emitted by downflow gas.

After nozzle (31E) is positioned above the center of wafer (W), CDIW is supplied to the upper and lower surfaces of wafer (W) from nozzle (31E) and under plate (22'). Accordingly, the topcoat film or the alkaline developing solution remaining on wafer (W) is washed away from wafer (W) by DCIW. When such procedure is finished, nozzle (31E) is moved to a position off wafer (W).

Next, the same as in substrate cleaning apparatus 5 of the first embodiment, the drying step and the substrate transfer step are conducted to complete the substrate cleaning process.

Substrate cleaning apparatus (5B) of the third embodiment is equipped with top plate 213, which covers the upper surface of wafer (W) and which has opening portion (213a) to flow a topcoat solution supplied from solution supply section (30A). Then, solution supply section (30A) supplies a topcoat solution to wafer (W) through opening portion (213a) formed in top plate 213.

Substrate cleaning apparatus (5B) of the third embodiment is equipped with under plate (22'), which covers the lower surface of wafer (W) and which has heating portion 23 to heat the topcoat solution supplied to wafer (W). Accordingly, the vaporization acceleration step is performed in substrate cleaning apparatus (5B) using heating portion 23 in under plate (22').

The solution supplied between under plate (22') and the lower surface of wafer (W) is not limited to a topcoat solution, and it may also be pure water. In substrate cleaning apparatus (5B), it is an option to supply HDIW (pure water at approximately 90° C.) to the lower surface of wafer (W) from under plate (22') after a puddle of the topcoat solution has formed on wafer (W) so that wafer (W) is heated to accelerate vaporization of the volatile component contained in the topcoat solution.

After a puddle of the topcoat solution has formed, it is an option to heat the topcoat solution on wafer (W) by supplying a high temperature gas (such as N2 gas) between under plate (22') and the lower surface of wafer (W). Alternatively, it is another option to bring under plate (22') with heating portion 23 (corresponding to a hot plate) into contact with wafer (W) so that wafer (W) is heated directly by under plate (22').

Yet alternatively, a UV-ray irradiation section may be provided below top plate 213. By so setting, the topcoat solution is activated by UV rays irradiated from the UV irradiation section, the same as in the second embodiment so that vaporization of the volatile component is accelerated.

Fourth Embodiment

Figure 9:
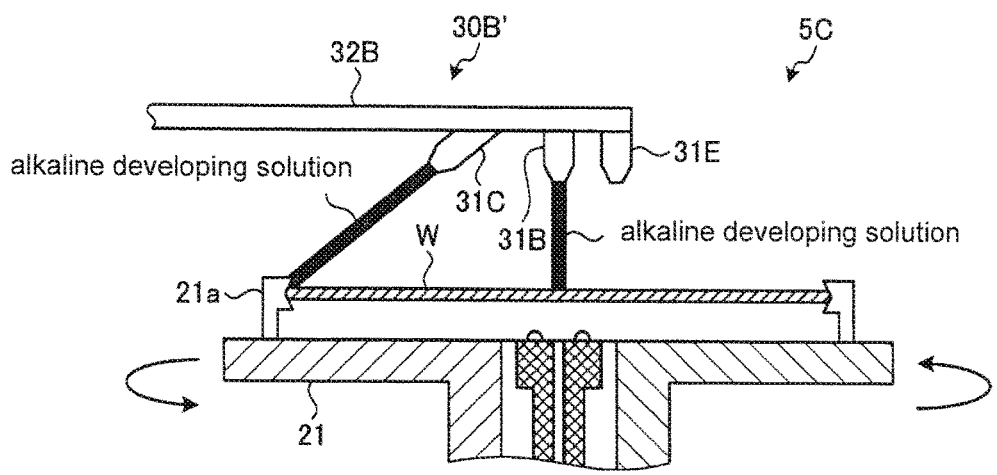
FIG. 9 is a view schematically showing the structure of a substrate cleaning apparatus according to a fourth embodiment.

A substrate cleaning apparatus according to a fourth embodiment is described by referring to FIG. 9. FIG. 9 is a schematic view illustrating the structure of a substrate cleaning apparatus of the fourth embodiment.

As shown in FIG. 9, substrate cleaning apparatus (5C) of the fourth embodiment has solution supply section (30B') instead of solution supply section (30B) equipped in substrate cleaning section 5 (see FIG. 3).

Solution supply section (30B') is further equipped with nozzle (31C) in addition to nozzles (31B, 31E). Nozzle (31C) is supported diagonally by arm (32B) and its discharge port is pointed toward the periphery of wafer (W) when nozzle (31B) is positioned above the center of wafer (W). Nozzle (31C) is an example of a third solution supply section.

Nozzle (31C) is connected to removal solution supply source (7c) (see FIG. 3) through a valve not shown here. Along the periphery of wafer (W), nozzle (31C) discharges an alkaline developing solution provided from removal solution supply source (7c). Accordingly, an alkaline developing solution under sufficient flow rate and velocity to clean holder portion (21a) is supplied to holder portion (21a).

The valve connected to nozzle (31C) is a valve different from valve (8c) (see FIG. 3) connected to nozzle (31B). Therefore, the timing of turning on/off the supply of an alkaline developing solution is controlled separately for nozzle (31B) and nozzle (31C). Since the rest of the structure of substrate cleaning apparatus (5C) is the same as that of substrate cleaning apparatus 5, the descriptions are omitted here.

Such cleaning procedures of holder portion (21a) are performed in substrate cleaning apparatus (5C) of the fourth embodiment using solution supply section (30B') according to commands from control apparatus 6. More specifically, in the above-described removal solution supply step (step (S105) in FIG. 4), after nozzle (31B) is positioned above the center of wafer (W), a valve (not shown) connected to nozzle (31C) and valve (8c) (see FIG. 3) are opened for a predetermined duration to supply an alkaline developing solution as a removal solution to rotating wafer (W) from nozzle (31B) and to rotating holder portion (21a) from nozzle (31C).

Accordingly, the topcoat film attached to holder portion (21a) is dissolved and removed from holder portion (21a). Namely, holder portion (21a) is cleaned.

The valve connected to nozzle (31C) is closed before valve (8c) (see FIG. 3) is closed. In doing so, the supply of the alkaline developing solution to holder portion (21a) from nozzle (31C) is turned off prior to stopping the supply of the alkaline developing solution to wafer (W) from nozzle (31B).

Accordingly, even if the topcoat film attached to holder portion (21a) is removed and spun over wafer (W) by the alkaline developing solution supplied from nozzle (31C), such spun-off topcoat film is prevented from reattaching to wafer (W) by the alkaline developing solution supplied from nozzle (31B) and is washed away.

Substrate cleaning apparatus (5C) of the fourth embodiment is further equipped with nozzle (31C) to supply an alkaline solution to holder portion (21a). Thus, the topcoat film attached to holder portion (21a) is also removed, and contamination or damage to wafer (W) or the raising of dust is prevented.

In the above example, prior to stopping the supply of the alkaline developing solution from nozzle (31B) to wafer (W), the supply of the alkaline developing solution from nozzle (31C) to holder portion (21a) is turned off. However, the timing of turning off nozzle (31C) is not limited to the above. For example, the supply of the alkaline developing solution from nozzle (31C) to holder portion (21a) may be turned off before the rinsing step is finished, namely, before the supply of CDIW from nozzle (31B) to wafer (W) is turned off. In such a case as well, the topcoat film spun off from holder portion (21a) onto wafer (W) is washed off by CDIW supplied from nozzle (31E).

It is sufficient as long as the supply of the alkaline developing solution from nozzle (31C) to holder portion (21a) is turned off before the supply of the treatment solution (alkaline developing solution) from nozzle (31B) to wafer (W), or the supply of CDIW from nozzle (31E) to wafer (W), is turned off.

Fifth Embodiment

Figure 10A:
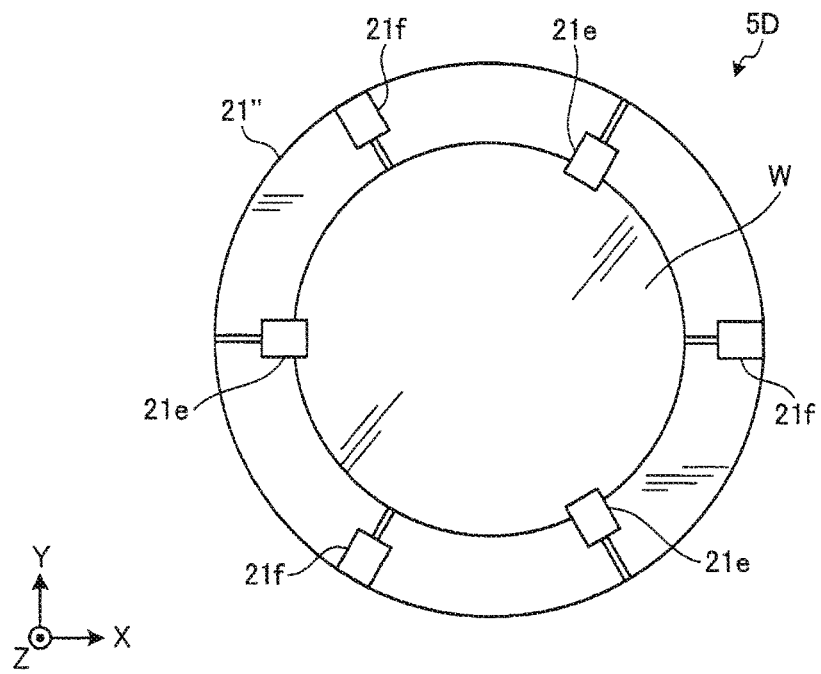
FIG. 10A is a view schematically showing the structure of a rotatable holding mechanism according to a fifth embodiment.
Figure 10B:
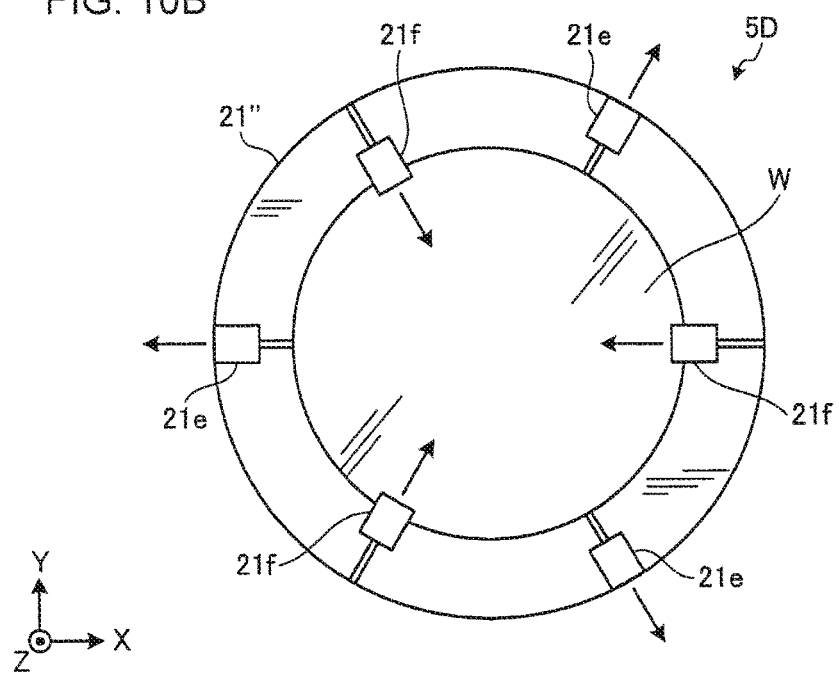
FIG. 10B is a view schematically showing the structure of the rotatable holding mechanism according to the fifth embodiment.

A substrate cleaning apparatus according to a fifth embodiment is described below. FIGS. 10A and 10B are schematic views illustrating the structure of a rotatable holding mechanism according to the fifth embodiment.

As shown in FIG. 10A, substrate cleaning apparatus (5D) of the fifth embodiment has rotatable holding mechanism (21") instead of rotatable holding mechanism 21 equipped in substrate cleaning apparatus 5 (see FIG. 3). Since the rest of the structure of substrate cleaning apparatus (5D) is the same as that of substrate cleaning apparatus 5, the descriptions are omitted here.

Instead of holder portion (21a) in rotatable holding mechanism 21, rotatable holding mechanism (21") has first holder portion (21e) to hold wafer (W) and second holder portion (21f) which can move independently of first holder portion (21e).

Multiple first holder portions (21e) are provided at an equal interval along the periphery of wafer (W); here, three are positioned at an interval of 120 degrees. Those holder portions (21e) are movable in a radial direction of wafer (W). In addition, second holder portions (21f) are positioned to have an equal interval between first holder portions (21e), and are movable in a radial direction of wafer (W), the same as in first holder portions (21e).

Substrate cleaning apparatus (5D) of the fifth embodiment has two types of holder portions, which are movable independently of each other. The holding hands of wafer (W) are switchable using those holder portions.

For example, wafer (W) is held by first holder portions (21e) in FIG. 10A. Then, after second holder portions (21f) are moved closer to wafer (W), first holder portions (21e) are moved away from wafer (W) so that the holding hands of wafer (W) are switched from first holder portions (21e) to second holder portions (21f) as shown in FIG. 10B.

Figure 11A:
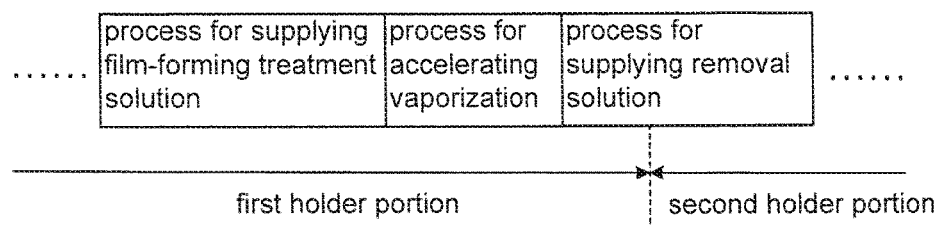
FIG. 11A is a view showing an example of timing for switching the holding hands of a wafer.
Figure 11B:
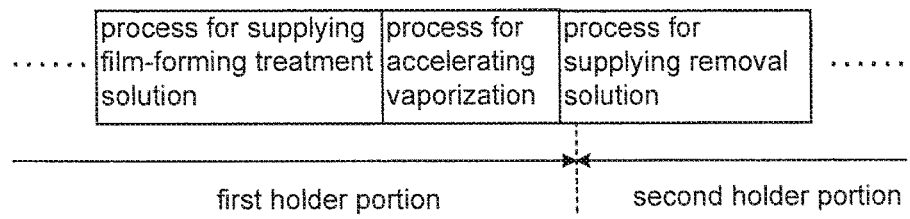
FIG. 11B is a view showing another example of timing for switching the holding hands of a wafer.

The timing of switching the holding hands of wafer (W) is described in FIGS. 11A and 11B. FIG. 11A shows a timing of switching the holding hands of wafer (W). Also, FIG. 11B shows another example of a timing of switching the hands of holding wafer (W).

As shown in FIG. 11A, switching the holding hands of wafer (W) between first holder portions (21e) and second holder portions (21f) is performed according to a predetermined timing during removal solution supply step (step (S105) in FIG. 4). More specifically, after the removal solution supply step has started, and when the topcoat film is mostly washed away by the alkaline developing solution so that the topcoat film is unlikely to attach to second holder portions (21f), second holder portions (21f) are moved toward wafer (W) and first holder portions (21e) are moved away from wafer (W).

In the fifth embodiment, the holding hands of wafer (W) are switched between first holder portions (21e) and second holder portions (21f). Thus, even if the topcoat film is attached to first holder portions (21e), contamination or damage to wafer (W) or the raising of dust is prevented by switching the holding hands to second holder portions (21f).

It is an option to switch the holding hands from first holder portions (21e) to second holder portions (21f) immediately after the vaporization acceleration step is finished as shown in FIG. 11B. When the topcoat solution is cured, it is unlikely to attach to second holder portions (21f). Thus, if the holding hands of wafer (W) are switched immediately after the vaporization acceleration step, contamination or damage to wafer (W) or the raising of dust is prevented.

Substrate cleaning apparatus (5D) may also be equipped with a nozzle to supply an alkaline developing solution to first holder portions (21e) the same as in substrate cleaning apparatus (5C) of the fourth embodiment. Using such a nozzle, first holder portions (21e) may be cleaned periodically. Such cleaning is preferred to be performed when a wafer is not present in the chamber.

Other Embodiments

In each of the embodiments described above, a rotatable holding mechanism was a mechanical chuck that holds the periphery of wafer (W). However, the rotatable holding mechanism is not limited to a mechanical chuck, and it may be a vacuum chuck that holds wafer (W) by suction.

Such a vacuum chuck may have a heating mechanism. By setting so, since wafer (W) adhered to and held by the chuck is directly heated, the volatile component contained in the topcoat solution is further effectively vaporized.

The same holder portions as holder portions (21a, 21e, 21f) described above may also be provided for a vacuum chuck and the holding hands of wafer (W) may be switched between the vacuum chuck, and the holder portions. In such an example, when conducting a supply step of film-forming treatment solution (step (S103) of FIG. 4), it is preferred to use a vacuum chuck, which does not have a section in contact with the upper surface of wafer (W) and which can spread a topcoat solution on the entire upper surface of wafer (W). Also, when the removal solution supply step is conducted, it is preferred to use holder portions that can easily clean the lower surface of wafer (W). Therefore, it is preferred to switch the holding hands of wafer (W) from the vacuum chuck to holder portions after the vaporization acceleration step is completed.

In each of the above embodiments, a topcoat solution was used as a film-forming treatment solution. However, a film-forming treatment solution is not limited to a topcoat solution.

The film-forming treatment solution may also be a treatment solution containing phenolic resin. Since phenolic resin also leads to curing contraction the same as acrylic resin described above, it is effective to provide tensile force to particles the same as topcoat solutions.

An example of a film-forming treatment solution containing phenolic resin is a resist solution. Resist solutions are film-forming treatment solutions to form resist film on wafer (W). In particular, novolac-based phenolic resin is listed.

When a resist solution is used for film-forming treatment solution, a thinner that dissolves a resist solution may be used as a removal solution. When a thinner is used as a removal solution, a rinsing step after the removal solution supply step may be omitted. Also, when a resist solution is used as a film-forming treatment solution, it is an option to supply a removal solution after an exposure-to-light process such as whole image exposure is performed on the resist film formed on wafer (W). In such an example, either a developing solution or a thinner may be selected as a removal treatment.

A synthetic resin contained in a film-forming treatment solution is not limited to acrylic resin or phenolic resin described above, and it may be any type as long as it causes curing contraction. Examples are as follows: epoxy resin, melanin resin, urea resin, unsaturated polyester resin, alkyd resin, polyurethane, polyimide, polyethylene, polypropylene, polyvinylidene chloride, polystyrene, polyvinyl acetate, polytetrafluoroethylene, acrylonitrile butadiene styrene resin, styrene acrylonitrile resin, polyamide, nylon, polyacetal, polycarbonate, denatured polyphenylene ether, polybutylene terephthalate, polyethylene terephthalate, polyphenylene sulfide, polysulfone, polyether ether ketone and polyamideimide.

As for a film-forming treatment solution, an antireflective film solution may also be used. An antireflective film solution is for forming antireflective film on wafer (W). Antireflective film is protective film to reduce surface reflection of wafer (W) and to increase permeability. When such an antireflective film solution is used as a film-forming treatment solution, pure water (such as CDIW or HDIW) that dissolves the antireflective film solution may be used as a removal solution.

In addition to a volatile component and synthetic resin, a film-forming treatment may further contain a predetermined chemical solution to dissolve wafer (W) or the material formed on wafer (W) or foreign substances attached to wafer (W). Here, "material formed on wafer (W)" means base film on wafer (W), for example. "Foreign substances attached to wafer (W)" are, for example, particles of metallic contaminants. Also, "predetermined chemical solution" is, for example, hydrogen fluoride, ammonium fluoride, hydrochloric acid, sulfuric acid, hydrogen peroxide solution, phosphoric acid, acetic acid, nitric acid, ammonium hydroxide and the like.

When surfaces of base film and particles are dissolved by such chemical solutions, the adhesive force of particles is lowered. Thus, particles are more likely to be removed.

Compared with chemical solutions in a conventional chemical cleaning process that uses chemical reactions, "a predetermined chemical solution" here is used under such conditions that reduce the amount of etching. Thus, compared with a conventional chemical solution cleaning process, erosion of base film is suppressed and particles are removed more effectively.

In each of the embodiments above, an alkaline developing solution was used as a removal solution. However, a hydrogen peroxide solution may be added to the alkaline developing solution. When a hydrogen peroxide solution is added to an alkaline developing solution, cracking on wafer surfaces by the alkaline solution is suppressed.

A removal solution may be organic solvents such as thinner, toluene, acetates, alcohols, glycols (propylene glycol monomethyl ether) or the like, or it may be an acidic developing solution such as acetic acid, formic acid, hydroxyacetic acid or the like.

A removal solution may further contain a surfactant. Since a surfactant works to reduce surface tension, it can suppress particles from reattaching to wafer (W) or the like.

In each of the above embodiments, wafer (W) was rotated by a substrate holding section that holds wafer (W) while allowing wafer (W) to rotate so that treatment solutions such as a topcoat solution is spread over wafer (W) due to centrifugal force generated by rotation. However, that is not the only option. For example, using a slit nozzle, a treatment solution may be spread over wafer (W) without rotating wafer (W). In such an example, the substrate holding section does not need a rotation mechanism.

When a method is used for removing particles by physical force, there are concerns that patterns formed on substrate surfaces may collapse due to physical force.

When a method is used for removing particles by chemical reactions of a chemical solution, there are concerns that base film of a substrate may be eroded by etching or the like.

Using a substrate cleaning apparatus, substrate cleaning system, substrate cleaning method and memory medium according to embodiments of the present invention, particles attached to a substrate are removed, and pattern collapse or base film erosion is suppressed.

A substrate cleaning apparatus according to an embodiment of the present invention has a first solution supply section and a second solution supply section. The first solution supply section provides a substrate with a treatment solution which contains a volatile component and forms film on the substrate. The second solution supply section provides a removal solution which dissolves the entire treatment solution supplied to the substrate by the first solution supply section and cured on the substrate through vaporization of the volatile component.

According to an embodiment of the present invention, particles attached to a substrate are removed and pattern collapse or base film erosion is suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A method for cleaning a substrate having circuit patterns, comprising:
    forming circuits that have circuit patterns without a resist film on the substrate such that the circuit patterns of the circuits are defined without the resist film on the substrate;
    setting the substrate having the circuits without the resist film defining the circuit patterns inside a cleaning chamber;
    supplying on a surface of the substrate a treatment solution which includes a volatile component and a synthetic resin and forms a treatment film such that the treatment solution entirely covers the circuits and the surface of the substrate;
    vaporizing the volatile component of the treatment solution covering the circuits and the surface of the substrate such that the treatment solution solidifies or is cured on the circuits and the surface of the substrate and that the treatment film is formed to entirely cover the circuits and the surface of the substrate and removes particles attached to the circuits and the surface of the substrate;
    supplying onto the treatment film formed on the circuits and the surface of the substrate a removal solution which removes the treatment film such that the removal solution charges the circuits, the surface of the substrate and the particles with zeta potential of a same polarity and dissolves the treatment film and that the treatment film is removed entirely from the circuits and the surface of the substrate; and
    rinsing the circuits and the surface of the substrate with a rinse solution after the supplying of the removal solution such that the particles including metallic contaminants and floating in the removal solution or the treatment film dissolved by the removal solution remaining on the circuits and the surface of the substrate are removed from the circuits and the surface of the substrate with the rinse solution,
    wherein the vaporizing comprises causing strain by volume contraction of the treatment solution when the treatment solution solidifies or is cured on the circuits and the surface of the substrate such that the particles attached to the circuits and the surface of the substrate are removed from the circuits and the substrate, and the removal solution is an alkaline solution including at least one selected from the group consisting of ammonium, tetramethyl ammonium hydroxide and choline.

2. The method for cleaning a substrate according to claim 1, wherein the supplying of the treatment solution and the supplying of the removal solution are conducted in the cleaning chamber, and the substrate is not transferred between the supplying of the treatment solution and the supplying of the removal solution.

3. The method for cleaning a substrate according to claim 2, further comprising accelerating vaporization of the volatile component of the treatment solution supplied on the circuits and the surface of substrate.

4. The method for cleaning a substrate according to claim 2, further comprising supplying a solvent which has affinity to the treatment solution.

5. The method for cleaning a substrate according to claim 2, wherein a contraction rate of the synthetic resin is such that when the treatment solution solidifies or is cured on the circuits and the surface of the substrate, the volume contraction of the treatment solution generates the strain and that the particles attached to the circuits and the surface of the substrate are removed from the circuits and the surface of the substrate.

6. The method for cleaning a substrate according to claim 2, wherein the treatment solution further includes a chemical solution which dissolves foreign matter attached on the circuits and the surface of the substrate or material deposited on the circuits and the surface of the substrate.

7. The method for cleaning a substrate according to claim 2, wherein the alkaline solution contains a hydrogen peroxide solution added thereto.

8. The method for cleaning a substrate according to claim 2, wherein the alkaline solution contains a surfactant added thereto.

9. The method for cleaning a substrate according to claim 1, further comprising accelerating vaporization of the volatile component of the treatment solution supplied on the circuits and the surface of substrate.

10. The method for cleaning a substrate according to claim 1, further comprising supplying a solvent which has affinity to the treatment solution.

11. The method for cleaning a substrate according to claim 1, wherein a contraction rate of the synthetic resin is such that when the treatment solution solidifies or is cured on the circuits and the surface of the substrate, the volume contraction of the treatment solution generates the strain and that the particles attached to the circuits on the surface of the substrate are removed from the circuits on the surface of the substrate.

12. The method for cleaning a substrate according to claim 1, wherein the treatment solution further includes a chemical solution which dissolves foreign matter attached on the circuits and the substrate or material deposited on the circuits and the substrate.

13. The method for cleaning a substrate according to claim 1, wherein the synthetic resin is a novolac-based phenolic resin.

14. The method for cleaning a substrate according to claim 11, wherein the synthetic resin is the acrylic resin.

15. The method for cleaning a substrate according to claim 1, wherein the alkaline solution contains a hydrogen peroxide solution added thereto.

16. The method for cleaning a substrate according to claim 1, wherein the alkaline solution contains a surfactant added thereto.

17. The method for cleaning a substrate according to claim 1, wherein the synthetic resin is the phenolic resin.

18. The method for cleaning a substrate according to claim 1, wherein the synthetic resin is the acrylic resin.

19. The method for cleaning a substrate according to claim 1, further comprising:
   accelerating vaporization of the volatile component of the treatment solution supplied on the circuits and the surface of substrate; and
   supplying a solvent which has affinity to the treatment solution.

20. The method for cleaning a substrate according to claim 1, further comprising:
   accelerating vaporization of the volatile component of the treatment solution supplied on the circuits and the surface of substrate; and
   supplying a solvent which has affinity to the treatment solution.

* * * * *